(12) United States Patent
Milbocker et al.

(10) Patent No.: US 12,268,255 B2
(45) Date of Patent: *Apr. 8, 2025

(54) DEVICE FOR DYNAMIC FLUID PINNING

(71) Applicant: BVW Holding AG, Cham (CH)

(72) Inventors: Michael Milbocker, Holliston, MA (US); Lukas Bluecher, Eurasberg (DE)

(73) Assignee: BVW Holding AG, Cham (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/307,525

(22) Filed: May 4, 2021

(65) Prior Publication Data

US 2021/0251318 A1    Aug. 19, 2021

Related U.S. Application Data

(63) Continuation of application No. 16/146,877, filed on Sep. 28, 2018, now Pat. No. 11,051,567.
(Continued)

(51) Int. Cl.
*B32B 3/30*    (2006.01)
*A41D 19/00*    (2006.01)
(Continued)

(52) U.S. Cl.
CPC .......... *A41D 19/0082* (2013.01); *B32B 3/30* (2013.01); *B32B 27/08* (2013.01);
(Continued)

(58) Field of Classification Search
CPC .. A41D 19/0082; A41D 2500/50; B32B 3/30; B32B 27/08; B81B 2203/0361; B08B 17/065; B61B 42/10
See application file for complete search history.

(56) References Cited

U.S. PATENT DOCUMENTS 9,120,670 B2    9/2015 Hulseman et al.
9,908,274 B2    3/2018 Hulseman et al.
(Continued)

FOREIGN PATENT DOCUMENTS

CN    106586950 A    4/2017

*Primary Examiner* — Joanna Pleszczynska
(74) *Attorney, Agent, or Firm* — Patterson Intellectual Property Law, P.C.; Ryan D. Levy; Mark A. Kilgore

(57) ABSTRACT

The present disclosure provides microstructured hydrophobic surfaces and devices for gripping wet deformable surfaces. The surfaces and devices disclosed herein utilize a split contact Wenzel-Cassie mechanism to develop multi-level Wenzel-Cassie structures. The Wenzel-Cassie structures are separated with a spatial period corresponding to at least one wrinkle eigenmode of a wet deformable surface to which the microstructure or device is designed to contact, allowing grip of the deformable surface without slippage. Microstructures of the present invention are specifically designed to prevent the formation of Shallamach waves when a shear force is applied to a deformable surface. The multi-level Wenzel-Cassie states of the present disclosure develop temporally, and accordingly are characterized by hierarchical fluid pinning, both in the instance of slippage, and more importantly in the instance of localization. This temporal aspect to the multi-level Wenzel-Cassie state
(Continued)

delays or prevents the transition from a wrinkled eigenmode state in a deformable surface to a buckled state in a deformable surface.

20 Claims, 23 Drawing Sheets

Related U.S. Application Data

(60) Provisional application No. 62/564,783, filed on Sep. 28, 2017.

(51) Int. Cl.
*B08B 17/06* (2006.01)
*B32B 27/08* (2006.01)
*B81C 1/00* (2006.01)

(52) U.S. Cl.
CPC ...... *B81C 1/00206* (2013.01); *A41D 2500/50* (2013.01); *B81B 2201/058* (2013.01); *B81B 2203/0361* (2013.01); *B81B 2207/056* (2013.01)

(56) References Cited

U.S. PATENT DOCUMENTS

| | | | |
|---|---|---|---|
| 9,988,201 | B2 | 6/2018 | Darin et al. |
| 10,377,044 | B2 | 8/2019 | Hulseman et al. |
| 10,458,053 | B2 | 10/2019 | Hulseman et al. |
| 10,575,667 | B2 | 3/2020 | Hulseman et al. |
| 10,687,642 | B2 | 6/2020 | Hulseman et al. |
| 10,889,005 | B2 | 1/2021 | Hulseman et al. |
| 2010/0028604 | A1 | 2/2010 | Bhushan et al. |
| 2013/0059123 | A1 | 3/2013 | Wang et al. |
| 2013/0172927 | A1* | 7/2013 | Natarajan ............ A61F 2/0077 264/319 |
| 2014/0200679 | A1 | 7/2014 | Bluecher et al. |
| 2015/0368838 | A1 | 12/2015 | Hulseman et al. |
| 2016/0169867 | A1 | 6/2016 | Khine et al. |
| 2017/0014111 | A1 | 1/2017 | Hulseman et al. |
| 2017/0044010 | A1 | 2/2017 | Hirata et al. |
| 2019/0062155 | A1 | 2/2019 | Hulseman et al. |
| 2020/0338808 | A1 | 10/2020 | Hulseman et al. |
| 2021/0086371 | A1 | 3/2021 | Hulseman et al. |

\* cited by examiner

DEVICE FOR DYNAMIC FLUID PINNING

CROSS-REFERENCE TO RELATED APPLICATIONS

This application is a continuation of U.S. patent application Ser. No. 16/146,877 filed on Sep. 28, 2018 and claims benefit of U.S. Provisional Application No. 62/564,783 filed on Sep. 28, 2017, which are hereby incorporated by reference in its entirety.

TECHNICAL FIELD

The present disclosure generally relates to microstructured surfaces and devices comprising the same. The surfaces disclosed herein are useful for preventing or minimizing slippage at a liquid interface between the microstructured surface and a deformable surface. The microstructured surfaces may have a hierarchical arrangement of microfeatures on a hydrophobic surface, and employ dynamic fluid pinning to increase contact angle hysteresis, thereby providing surfaces that are adherent rather than repellent.

BACKGROUND

Wetting is the relationship between a liquid phase and a solid phase, and wetting is essential to fluid pinning. Wetting is characterized by a contact angle at the interface between a liquid and a solid surface. The contact angle is representative of the intermolecular interactions between the liquid and solid wherein the energy of interaction is minimized. The contact angle can also be associated with a force balance between adhesive and cohesive forces. Wetting is important in the bonding or adherence of two materials.

There are two types of wetting: non-reactive (static) wetting and active (dynamic) wetting. Adhesive force between a liquid and solid cause a liquid drop to spread across the surface of the solid (Wenzel wetting). Cohesive force within the liquid causes the drop to ball up and avoid contact with the surface (Cassie-Baxter wetting). The juxtaposition of the adhesive and cohesive forces results in fluid pinning, which is essentially a balance between the tendency for a fluid to spread adherently on a surface and the tendency for a fluid to resist attachment and spreading on a surface.

The contact angle is a complicated function of surface texture and chemical composition of the relevant phases. When the contact angle is small for a liquid on a surface texture, the liquid-solid interface is said to be in a Wenzel state. When the contact angle is large for a liquid on a surface texture the liquid-solid interface is said to be in a Cassie-Baxter state. When part of a liquid is in a Wenzel state and another part of the liquid is in a Cassie-Baxter state, the combined state is said to be in a Wenzel-Cassie state.

A Wenzel-Cassie surface texture induces a state with a large difference between advancing and receding contact angles (contact angle hysteresis). The Wenzel-Cassie state is a compound state on a surface in which at one location there is at least one Wenzel state and at another location at least one Cassie-Baxter state. A Wenzel state (wetting state) is characterized by a small contact angle. A Cassie-Baxter state (de-wetting state) is characterized by a large contact angle. It is the opposite nature of these two states in juxtaposition which leads to fluid pinning.

Fluid pinning is the state in which fluid in contact with a microstructured surface is localized. Fluid pinning is a general term, herein when specificity is important to understand a enabling aspect, fluid pinning on a Wenzel-Cassie surface will be called Wenzel-Cassie pinning.

A hierarchical Wenzel-Cassie state is developed on a microstructured surface with a multiplicity of spatial scale levels. Each level may induce separately a Wenzel or Cassie-Baxter state or jointly, or pairs of Wenzel and Cassie-Baxter states may develop in combinations between the spatial scale levels.

Wenzel-Cassie states are three phase phenomena, and classically consist of solid, liquid and gaseous contacts mediated by the dimensionality of the surface texture. Less commonly, a Wenzel-Cassie state may comprise a solid, aqueous liquid and lipid phase. Wenzel-Cassie states are characterized by the spatial juxtaposition of microstructures with high surface energy with microstructures with low surface energy. Alternatively, the juxtaposition of microstructures can be characterized by one microstructure being more hydrophobic relative to the other microstructure, or lipophilic and the other hydrophilic.

The concept of surface energy is central for the analysis of wetting phenomena. Atoms or molecules at the surface of a solid or liquid have fewer bonds with neighboring atoms compared to those in the bulk of a solid or liquid. Energy is spent in breaking the bonds when a surface is created. As a result, the atoms at the surface have higher energy. If a liquid droplet is placed on a solid surface, the liquid and solid surfaces come together under equilibrium at a characteristic angle called the static contact angle. The contact angle is related to the surface energies of the solid-hydrophobic, solid-hydrophilic, and hydrophilic-hydrophobic interfaces.

A dynamical Wenzel-Cassie microstructure is a hierarchical texture on which a multiplicity of Wenzel and Cassie-Baxter state pairs develop temporally. Cassie-Baxter and Wenzel states on a microstructured surface develop when exposed to a liquid environment; typically, a liquid environment at the interface between a microstructured device and a deformable surface.

When the fluid pinning evolves temporally, either in a non-translational state or in an infinitesimal translation state the result is hierarchical pinning. Hierarchical pinning is to be distinguished from Wenzel-Cassie pinning. Wenzel-Cassie pinning is a static state in thermodynamic equilibrium. Hierarchical pinning is a dynamic state that is either not in thermodynamic equilibrium, even in the absence of infinitesimal translation; or, is taken out of thermodynamic equilibrium by the application of a force that results in an infinitesimal translation. In the former, evaporation of the aqueous-air or aqueous-lipid interface can temporally evolve the fluid pinning structure in the absence of applied force. Indeed, even Brownian motion within the liquid interface can be responsible for fluid pinning structure modification. These dynamical aspects, characteristic of hierarchical pinning, are due to environment interaction, whether the interaction be intentional or ambient.

The Cassie-Baxter and Wenzel states are generally not dynamic. However, most solid wetting is dynamic. Accordingly these states only exist in certain extremely simplistic situations. In the general case, the contact angle is dependent on the triple line. The triple line is in contact with the interface surface, but cannot rest on the interface surface like the rest of the drop. To satisfy either the pure Cassie-Baxter theory or the Wenzel theory, the triple line would have to contain a nonphysical discontinuity. In order to theoretically align the Cassie-Baxter equation with the principle that the triple line must follow a minimized energy state one must assume there is a dynamical aspect to the state.

The dynamical aspect of the state is sometimes called the precursor film. This film of submicrometer thickness advances ahead of the motion of the droplet (or an interface between two surfaces) and is found around the triple line. Importantly, the precursor film allows the triple line to bend and take different conformations that avoid a discontinuity. With the introduction of the precursor film concept, the triple line can follow energetically feasible conformations and thereby correspond to the predictions of the Cassie-Baxter model. An important ingredient in the precursor film theory is capillary action, which is characteristically temporal in nature.

On multi-level microstructures, an interface exists between hierarchically defined regions, one region of which is hydrophilic and the other region of which is hydrophobic or oleophilic. The hydrophilic region is a water wetted surface in equilibrium with a mixed water-fatty acid phase, and the hydrophobic region is a saturated fatty acid wetted surface in equilibrium with the same mixed water-fatty acid phase.

In the context of the precursor film theory, here adapted to hierarchical microstructured surfaces, the usual state of partial wetting consists of macroscopic fatty acid liquid drops associated with a thin Wenzel-Cassie pinned fatty acid liquid film, where the Wenzel-part of the Wenzel-Cassie pinning is water. On the other hand, the state of complete wetting in the Wenzel-Cassie state corresponds to a macroscopic saturated fatty acid liquid layer, homogeneously spread over the water surface. The intermediate state of frustrated wetting consists of a mesoscopic fatty acid film on top of which fatty acid drops with finite contact angle can form. It is known in the literature that the transition from partial to complete wetting does not take place in one step. Two distinct transitions occur, well separated in temperature and pressure.

Frustrated wetting refers to the mesoscopically thick film forming on one hierarchical structure, the formation of which is mediated by the long-range tail of the interaction free energy between the hydrophobic and hydrophilic interface between hierarchical levels. Depending on the relative sizes of the hierarchical levels and their hydrophobicities, the formation of a macroscopically thick wetting layer is either promoted or inhibited. When the hydrophilic region is large, the interface is antagonistic to macroscopic wetting by fatty acids. Thus, antagonistic van der Waals forces frustrate complete wetting, while the effect of all other force contributions promote complete wetting.

A related phenomenon is contact surface frustration. In this phenomenon, the contact surface is in a metastable state, usually created by the boundary conditions imposed by the hierarchical topology. In one state, a contact surface that favors the hydrophobic phase develops, and in the other state a contact surface that favors the hydrophilic phase develops. When the interface is perturbed, either barically, thermally, or by application of a shear force, the contact surface can discontinuously transition from one state to the other state. Well balanced metastable configurations can undergo prolonged oscillation between the states. The inability of the interface to reach an equilibrium state provides the desired effect of enhanced fluid pinning. Contact surface frustration maintains an energy barrier which must be overcome before the device-surface interface can be organized along the translational direction.

A hydrophilic surface makes a contact angle with a drop of pure water than is less than 90 degrees. A superhydrophobic surface is a surface that has a contact angle with water of greater than 140 degrees. The notion of hydrophilicity has a kinetic interpretation as well. According to the Washburn model, hydrophilicity is related to the filling rate of capillaries. For example, a filling rate of about 2 mm/min for a glass capillary with an inner diameter of 5 nm corresponds to a contact angle of 80 degrees.

Hydrophilicity is also associated with surface energy. Generally, high surface energy corresponds to a hydrophilic surface, and low surface energy corresponds to a hydrophobic surface. Surface energy is a complex combination of the chemistry and the geometry of a surface.

There are four generally recognized wetting states: 1) Wenzel, 2) Cassie or Cassie-Baxter, 3) Wenzel-Cassie, and 4) hemi-wicking. A hierarchical surface may comprise any combination of these wetting states. Consider a surface comprising a substrate having a first level A and a terminal level B, and a drop of water that covers a region C of the substrate. Not all of the substrate in region C need be in contact with the water. A Wenzel state is a wetting state in which pure water contacts the entire surface of both levels A and B, and thus covers the entire surface of the substrate in the region C. A Cassie state is a wetting state in which the water is in contact with Level B only. Finally, a Wenzel-Cassie state is a wetting state in which the water is in contact with one level and only partially in contact with another level in the region C. A hemi-wicking state is any of the above three wetting states in which the water contacts a region outside of the region C.

A Wenzel wetting state is one in which water interacts with a surface initially by attracting to the substrate, followed by water saturation and the vanishing of the attraction. A Cassie wetting state is one in which water interacts with a surface by repelling it. A Wenzel-Cassie wetting state both attracts and repels a wet surface, and consequently cannot be saturated without applying compression energy. Consequently, a hemi-wicking Wenzel-Cassie state would be particularly useful in surfaces that contacts living tissue.

All of these wetting states result from a complex interaction of the dipole nature of water with the dipole nature of the substrate and an interaction between the surface tension of water and the geometry of the substrate surface. In completely liquid environments, such as those found in the human body, water surface tension can result from water localized on hydrophilic regions of a substrate interacting with lipids localized on lipophilic regions of a substrate. Accordingly, while the four above identified wetting states traditionally are defined in a gas-water-solid system, analogous wetting states are obtained in a lipid-water-solid system. In most cases, hydrophobic regions on a hierarchical surface correspond to lipophilic regions when placed in a living body.

There is a need for superhydrophobic hierarchical contact surfaces that are useful particularly for medical implants, medical devices and other contact indications. Such surfaces would provide appropriate tissue adherence. Furthermore, there is a need for superhydrophobic hierarchical surfaces having improved mechanical features such that they do not contain geometrical features that are subject to distortion or fouling. The present disclosure addresses these needs.

BRIEF SUMMARY

The present disclosure provides microstructured surfaces that can be used for gripping, either inside or outside of a mammalian body. The microstructured surfaces produce advantageous contact interfaces with a contact surface, particularly in the presence of a liquid environment. More particularly, the present disclosure provides a device, such as a medical device, comprising a microstructured surface having at least two hierarchical levels, wherein the at least two hierarchical levels produce Wenzel-Cassie fluid pinning states when placed in contact with a wet surface, and wherein the at least two hierarchical levels produce split contact Wenzel-Cassie wetting states when in contact with the wet surface. The surface, in some embodiments, is a flexible or deformable surface, such as mammalian skin or internal tissues. In certain embodiments, the hierarchical levels produce frustrated wetting states or frustrated contact surfaces. In certain embodiments, the present disclosure provides metastable wetting states on at least one hierarchical level.

In some embodiments, the hierarchical levels are periodic. More particularly, the hierarchical levels possess a periodicity capable of accommodating a wrinkle eigenmode of a target deformable surface. In some embodiments, the hierarchical levels inhibit the evolution of a buckled state in a target deformable surface when a shear force is applied to said device.

The surfaces and devices of the present disclosure advantageously inhibit translation of the surface or device when in contact with a deformable surface when a shear force is applied to said device.

In certain embodiments, a structural hierarchical level is replaced with a smooth chemical surface with the same hydrophilicity, hydrophobicity, oleophobicity or oleophilicity of said replaced hierarchical level.

In certain embodiments, the hierarchical structures are self-similar.

In some embodiments, the microstructured surface comprises two hierarchical levels, which in other embodiments, the hierarchical surface comprises three hierarchical levels.

In some embodiments, the microstructured surface comprises, a first hierarchical level ranging from 1-20 micrometers (microns) in width, a second hierarchical level ranging from 10 to 500 microns in width, and a third hierarchical level ranging from 100-10000 microns in width. The width, as described herein, refers to the largest dimension of a microstructure in the x,y plane of the surface.

In some embodiments, the microstructured surface comprises a first hierarchical level ranging from 1-20 micrometers (microns) in height, a second hierarchical level ranging from 10 to 500 microns in height, and a third hierarchical level ranging from 100-10000 microns in height.

In some embodiments, the microstructured surface comprises a first hierarchical level with a pitch ranging from 1-20 micrometers (microns), a second hierarchical level with a pitch ranging from 10 to 500 microns, and a third hierarchical level with a pitch ranging from 100-10000 microns.

In certain embodiments, the device comprises a multi-periodic structure.

In some embodiments, the microstructured surface, when in contact with a wet contact surface forms an interface, the interface comprising at least four contact surfaces, each contact surface comprises a solid contact surface, a hydrophobic liquid contact surface, a hydrophilic liquid contact surface.

In some embodiments, the microstructured surface, when in contact with another wet surface, forms an interface comprising a solid contact surface, a gas contact surface, a hydrophilic liquid contact surface.

In some embodiments, the hierarchical levels are multi-periodic, and wherein at least one period matches one or more wrinkle eigenmodes of a target deformable surface. In further embodiments, at least two contact surfaces are frustrated. In further embodiments, Shallamach motion in a target contact surface is inhibited.

In some embodiments, at least one Wenzel-Cassie wetting state transitions to a Wenzel wetting state when at least 1 mN of shear force is applied to said device. In other embodiments, at least one Wenzel-Cassie wetting state transitions to a Cassie-Baxter wetting state when at least 1 mN of shear force is applied to said device.

In other embodiments, the microstructured surface has a contact hysteresis of at least 10 degrees.

An important consequence of the dynamic aspect of wetting states on hierarchically microstructured surfaces is that contact lines, and not the contact area, are important in establishing a fluid pinning state. On hierarchically microstructured surfaces in contact with deformable surfaces, the contact lines are dynamically reforming, sometimes involving one subset of microstructure scales and at other times involving another subset of microstructure scales, depending on the ever-changing stresses applied to the device-surface interface. For this reason microstructured devices of the present invention are unusually stabilized against shear translation.

This point of view was arrived upon by the applicants through a set of experiments involving air-water and lipid-water interface experiments involving hierarchically microstructured devices in contact with wet deformable surfaces. The results of these experiments are contrary to the conventional belief that contact surface area, friction, and the like, are the primary inputs in determining the stability of a fluid pinning state.

Furthermore, when a multiplicity of Wenzel states are anchored by Cassie-Baxter states at the interface of a hierarchically microstructured surface and a deformable wet surface, the dynamical aspect of the contact line between the Wenzel states and the Cassie-Baxter states is practically the only input in determining the strength of a fluid pinning state. The magnitude of fluid pinning, also the magnitude of the contact angle hysteresis, is determined by interactions of the liquid and the solid at the three phase contact line alone, and that the interfacial area within the contact perimeter is irrelevant.

Hierarchical microstructured surfaces are unique in that within a contact interface a multiplicity of contact surfaces may exist, primarily between the hierarchical levels. For non-textured surface in contact with a deformable surface, the contact surface exists only at the edges of the two surfaces. It is important to recognize that a hierarchical microstructured surface would possess an extremely complicated set of contact lines coupled together by the cohesive energy of the water layer between a microstructured device and deformable surface.

The Cassie-Baxter model has long been thought to relate the contact angle hysteresis to the areal proportion of the liquid-solid and liquid-vapor interfaces. The Cassie-Baxter model assumes the advancing and receding contact angles represent a static state in thermodynamic equilibrium. The Cassie-Baxter model fails as a description of the interface states of the present invention because the contact lines are hierarchical and constantly changing.

In fact, it is a hypothesis of the applicants that the equations of motion of the contact lines are described by highly nonlinear equations, and thus perturbations as small as those generated by Brownian motion may play a role in the stability and strength of the localization of a hierarchically microstructured device on a wet deformable surface. However, the mechanism of the present invention is not dependent upon this hypothesis, since in practice, forces between a microstructured device and a deformable surface are never static. Indeed, the very act of trying to displace the microstructured device with respect to the deformable surface serves to stabilize the microstructure device against translation.

Astonishingly, the Cassie-Baxter model is particularly inaccurate regarding receding contact angles. This observation is particularly important to the present invention, since it is the extra-adhesive nature of the receding contact lines that result in the advancing edge of the microstructured device to advance over the deformable surface, while the receding edge of the microstructured device does not advance over the deformable surface under the action of infinitesimal displacement. Advancing and receding contact angles are typically associated with the edge of a droplet or edge of contact between device and surface. In hierarchical interfaces, contact surfaces, and hence advancing and receding contact angles, can exist within the volume of the device-surface interface.

While it is fashionable in the field of microstructure research, due to dramatic advances in fabrication technology, to test every imaginable microstructure, doing so does not lead to the inventions disclosed herein. The applicants reveal the ratio of microstructure sizes, aspect ratios, surface energies, hydrophilicity and lipophilicity of the materials and microstructures, and topology of contact surfaces which precisely and uniquely work in combination to yield the anti-slip functionality of the present invention.

Mechanical deformation of a deformable surface in contact with a microstructured device is usually considered detrimental to device localization on the deformable surface. It has been unexpectedly discovered that when the microstructure on the microstructured device has a periodic structure that matches one or more wrinkle eigenmodes of the deformable surface, device localization is enhanced. The localization is further enhanced if the periodic structure on the microstructured device is hierarchical, more preferably self-similar, where the period of each hierarchical level of the microstructured device approximately couples to a corresponding wrinkle eigenmode of the deformable surface.

Indeed, a microstructured device with the right combination of hierarchical structure matching some of the wrinkle eigenmodes of the deformable surface serves to reinforce one or more wrinkle eigenmode states. The shear stress required to break such an eigenmode locked state and cause slippage is significantly higher than the shear stress required to cause slippage when the deformable surface is in a buckled state.

On dry deformable surfaces, the stress between the microstructured device and the deformable surface is typically mechanical engagement between microstructure features on the microstructured device and irregularities on the deformable surface. Mechanical engagement can also be delivered by localized friction points and destructive impaling of the deformable surface by the microstructures on the microstructured device. In the mechanism of localization on dry deformable surfaces, the mechanism corresponds to the microstructure of the microstructured device interleaving with the stress-induced wrinkle eigenmodes of the deformable surface. Anticipating the eigenmodes of the deformable surface and building in that eigenmode as a periodic microstructure on a microstructured device results in dramatically higher device localization on the deformable surface. The situation is analogous to the interlocked teeth of two cogs.

While the primary object of the present invention is to localize hierarchical microstructured devices on wet surfaces, the dry case is not excluded regarding the accommodation of wrinkle eigenmodes.

On wet deformable surfaces, the stress between the microstructured devices of the present invention and a wet deformable surface can include mechanical engagement, but more importantly includes fluid pinning. Fluid pinning occurs in a Wenzel-Cassie state when spatially alternating Wenzel and Cassie-Baxter states reside simultaneously at the interface between the microstructured device and the deformable surface. Matching the surface periodicity of the microstructured device to the wrinkle eigenmodes of the deformable surface results in an unexpected high resistance to shear translation of the microstructured device relative to the deformable surface.

When the microstructured surface of the present invention is hierarchical with a multiplicity of periodicities and aspect ratios corresponding to a multiplicity of wrinkle eigenmodes of the deformable surface, it was discovered the localization of the microstructured devices become remarkably resistant to translation across a broad range of shear stresses.

Mechanical instability of a deformable surface is typically considered an undesirable characteristic in applications where a device must interface with a deformable surface. Conversely, nature makes use of these instabilities to enhance the performance of biological systems; for example, the wrinkling of the skin on finger tips to enable precise manipulation of objects. Taking the perspective that the instability of deformable surfaces can be harnessed leads to the discovery that novel mechanical phenomenon are possible that have not been appreciated to date.

The present invention is aimed at facilitating wrinkle instability of a deformable surface while inhibiting buckle instability. When the internal stress of the deformable surface exceeds a critical threshold, undulations occur on the surface. The periodicity and amplitude of such undulations depend on the mechanical properties of the deformable surface, interface between deformable surface and microstructured device, and the stress state. When the undulations approximately match the periodicity of the microstructured device, the device remains in contact with the deformable surface and the instability is a wrinkle instability. When the undulations do not match the periodicity of the microstructured device, the deformable surface buckles, resulting in regions where the microstructured surface lifts away from the deformable surface. Buckling is significantly reduced when the periodicity of the microstructured surface matches at least one wrinkle eigenmode of the deformable surface.

Counter-intuitively, high surface area of a microstructured device does not always correlate with enhanced device localization. For example, high aspect ratio microstructured surfaces have more surface area compared with a device of the same dimensions with lower aspect ratio. High aspect ratio microstructures are microstructures in which the height scale (out-plane) is larger than the lateral (in-plane) dimension. For high aspect ratio microstructured devices, buckling of the deformable surface is readily initiated by an external load. Buckling results in a significant reduction in the shear stress necessary to translate the microstructured device relative to the deformable surface.

The wavelength and amplitude for wrinkling of different media are obtained by solving the geometrically nonlinear eigenvalue problem based on the total bending energy and elastic energy. The linear interface (bilayer) response between a microstructured device and a deformable surface is an eigenmode of the eigenvalue problem which depends only on the material properties of the deformable surface.

Intuitively, splitting a flat contiguous contact surface into multiple contact points should decrease the total area which makes contact to the deformable surface. In fact, the opposite occurs. The adhesion mechanism is known as contact splitting. It is the primary mechanism that endows the Gecko with its astonishing climbing ability.

In the present invention, contact splitting is achieved by making the microstructured device surface hierarchical. In such an arrangement, the highest points on the microstructure device contact the wet deformable surface first where a first adhesive Wenzel-Cassie state is achieved. This first adhesive state draws the device into more intimate contact with the deformable surface. More proximal contact between the microstructured device and the deformable surface engages a second level of hierarchy and forms a second adhesive Wenzel-Cassie state. The present invention employs at least two hierarchical levels, and more preferably three hierarchical levels.

Each hierarchical level defines a periodicity which is optimally adhesive to a range of wrinkle eigenmodes of the deformable surface. Accordingly, rather than a single contact geometry, multiple contact geometries make the shear resistance effective across a broad range of shear forces.

The net effect, under stochastic shear force, is a significantly improved resistance to shear translation. The failure point is generally associated with a buckling event. In the buckling event, the device-surface detachment cannot propagate. The buckling event must be reinitiated at each hierarchical level, limiting buckle propagation, allowing the Wenzel-Cassie states to re-establish adhesion prior to complete contact failure.

However, it should be recognized the split contact Wenzel-Cassie state of the microstructured surfaces of the present invention are not the mechanical split contact states recognized in the field of the art. The split contact Wenzel-Cassie state is an enabling discovery of the present invention.

In studies of elastic membranes under tension or compression it has been observed that the transition between one wrinkle eigenmode of the membrane to another wrinkle eigenmode of the membrane is not continuous. This behavior can be explained in terms of a tradeoff between buckling and wrinkle eigenmode formation.

For an unconstrained membrane under tension, the amplitude in the wrinkle eigenmode builds until the energy in the eigenmode is sufficient to transition to a higher eigenmode with lower amplitude. When the membrane is constrained, so that higher eigenmodes cannot form, the membrane transitions to a buckled state.

In the buckled state the interface between the microstructured device and the deformable surface transitions to a sliding state. Shallamach microstructures exhibit this tendency to hop from one wrinkle eigenmode to another, accompanied also by slippage, primarily because the energy input exceeds the energy to transition to the buckled state. The characteristic motion is grab in the wrinkle eigenmode state and slide in the buckled state. Once the excess energy is released during sliding a new eigenmode state starts to develop.

By promoting wrinkle eigenmode hoping rather than transition to the buckled state delays the onset of buckling, and ultimately inhibits low friction sliding.

It is one object of the present invention to prevent the Shallamach process altogether by placing hierarchical microstructure on the microstructured device such that the periodicity of at least one of the hierarchical microstructures matches the frequency of at least one wrinkle eigenmode. The hierarchical microstructure is intended to promote the formation of wrinkle eigenmodes rather than the buckled state.

It is important to note that the frequency of Shallamach microstructures do not correspond to the frequency of the wrinkle eigenmodes of the deformable surface. The frequency of Shallamach microstructures are a continuous function of the slip speed, and hence are not quantized, as wrinkle eigenmodes are quantized. In fact, a full wrinkle eigenmode never fully develops on a deformable surface in the Shallamach state. The length of the partially formed wrinkle eigenmode is proportional to the slip speed. The combination of buckling slips and partial wrinkle eigenmode states results in a spatial Shallamach microstructure with a spatial period proportional to the slip speed.

Another object of the present invention is to provide embodiments of hierarchical microstructured devices where the hierarchical structure is stacked.

Another object is to provide embodiments of hierarchical microstructured devices where the microstructure produces Wenzel-Cassie fluid pinning states on a multiplicity of size scales.

Another object is to provide embodiments of hierarchical microstructure devices where the hierarchical levels produce split content Wenzel-Cassie states.

Another object is to provide embodiments of hierarchical microstructure devices where the hierarchical levels produce frustrated wetting states.

Another object is to provide embodiments of hierarchical microstructured devices where the hierarchical levels produce frustrated contact surfaces.

Another object is to provide embodiments of hierarchical microstructured devices where the hierarchical levels produce metastable wetting states on at least one hierarchical level.

Another object is to provide embodiments of hierarchical microstructured devices where the hierarchical levels possess a periodicity capable of accommodating the wrinkle eigenmodes of the target deformable surface when a shear force is applied to the embodiment device.

Another object is to provide embodiments of hierarchical microstructured devices where the hierarchical levels inhibit the evolution of the buckled state in a target deformable surface when a shear force is applied to the embodiment device.

Another object is to provide embodiments of hierarchical microstructured devices where the hierarchical levels inhibit translation of the device when in contact with a deformable surface when a shear force is applied to the embodiment device.

Another object is to provide embodiments of hierarchical microstructured devices where one or more pattern hierarchical levels is replaced with a smooth chemical surface with the same hydrophilicity, hydrophobicity, or oleophobicity of the replaced hierarchical microstructure.

Embodiments of the present invention may satisfy one or any combinations of the aforementioned objectives

| L3: | 3 um circle/fins | 6 um pitch | triangular array | 4 um height |
| L2: | 35 um circle | 45 um pitch | triangular array | 45 um height |
| L1: | 750 um sinusoid | 750 um pitch | triangular array | 220 um height |

Figure 21:
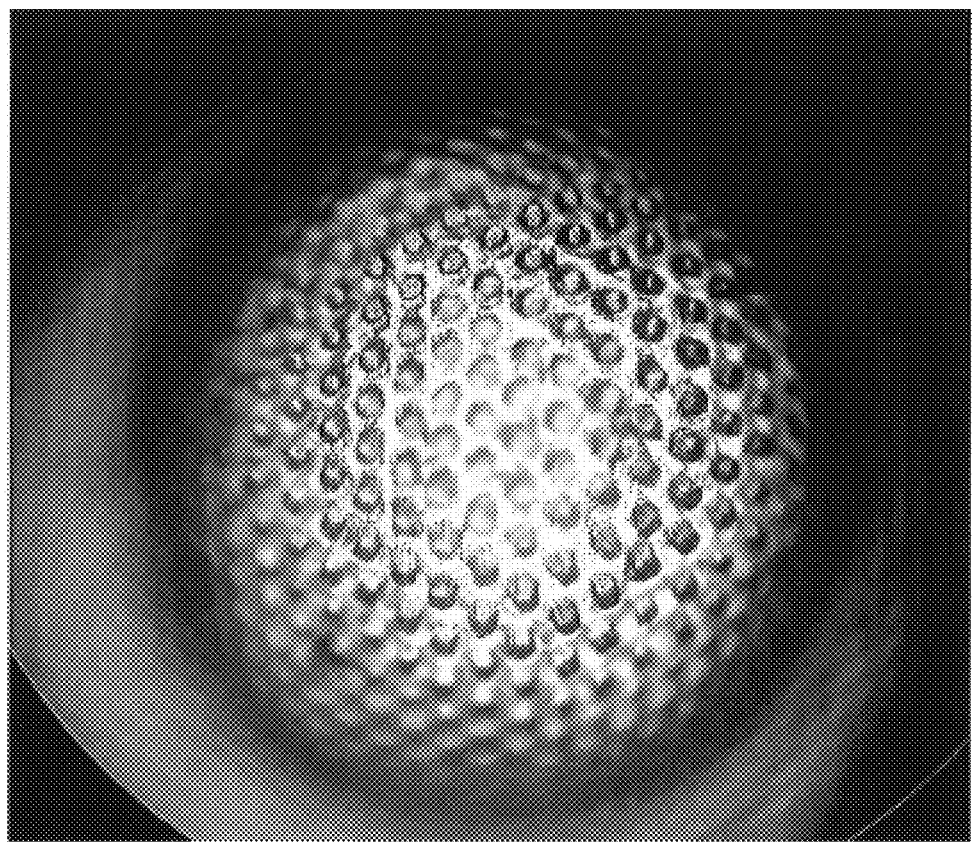
FIG. 21 depicts a particular embodiment of a hierarchical microstructure device with dimensions.
Figure 22:
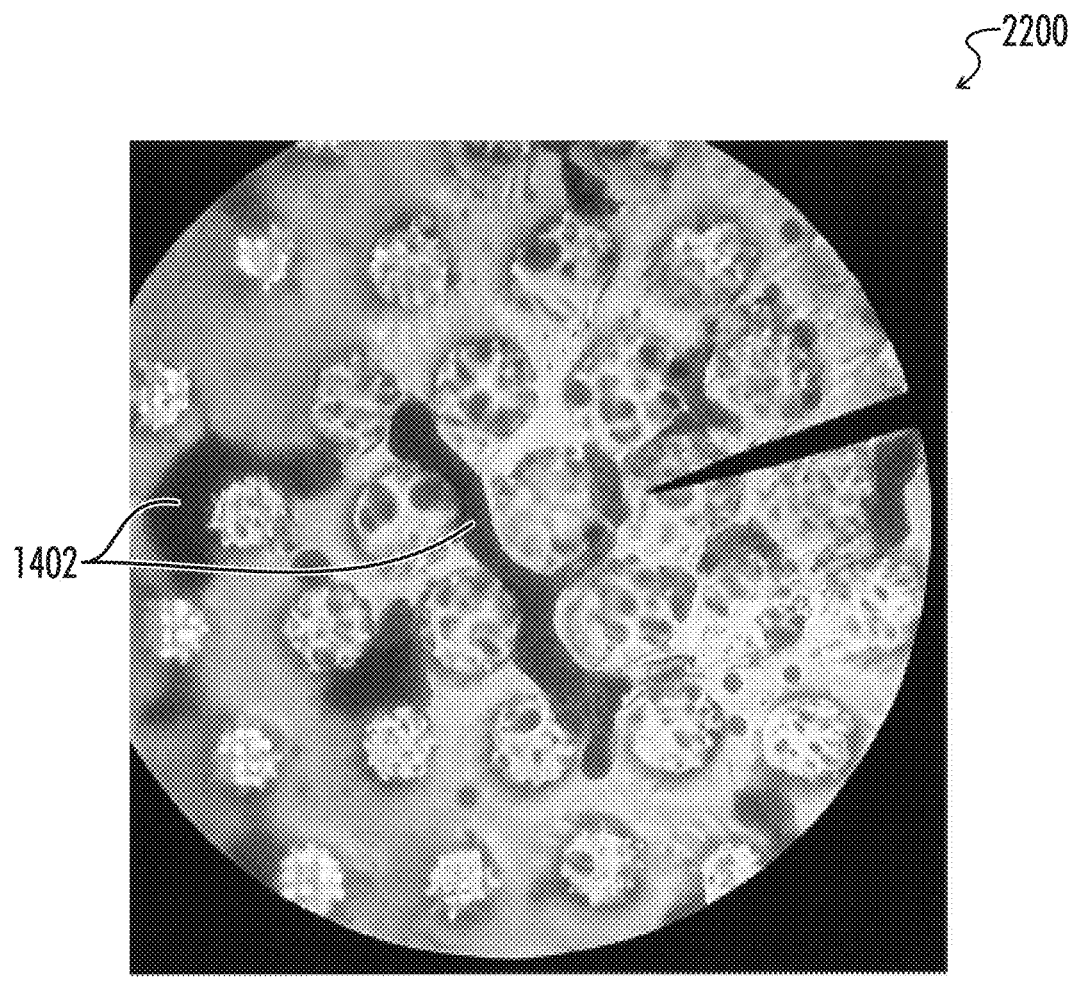

FIG. 22 depicts water pinning on the L2 and L1 microstructures of FIG. 21.

Figure 23:
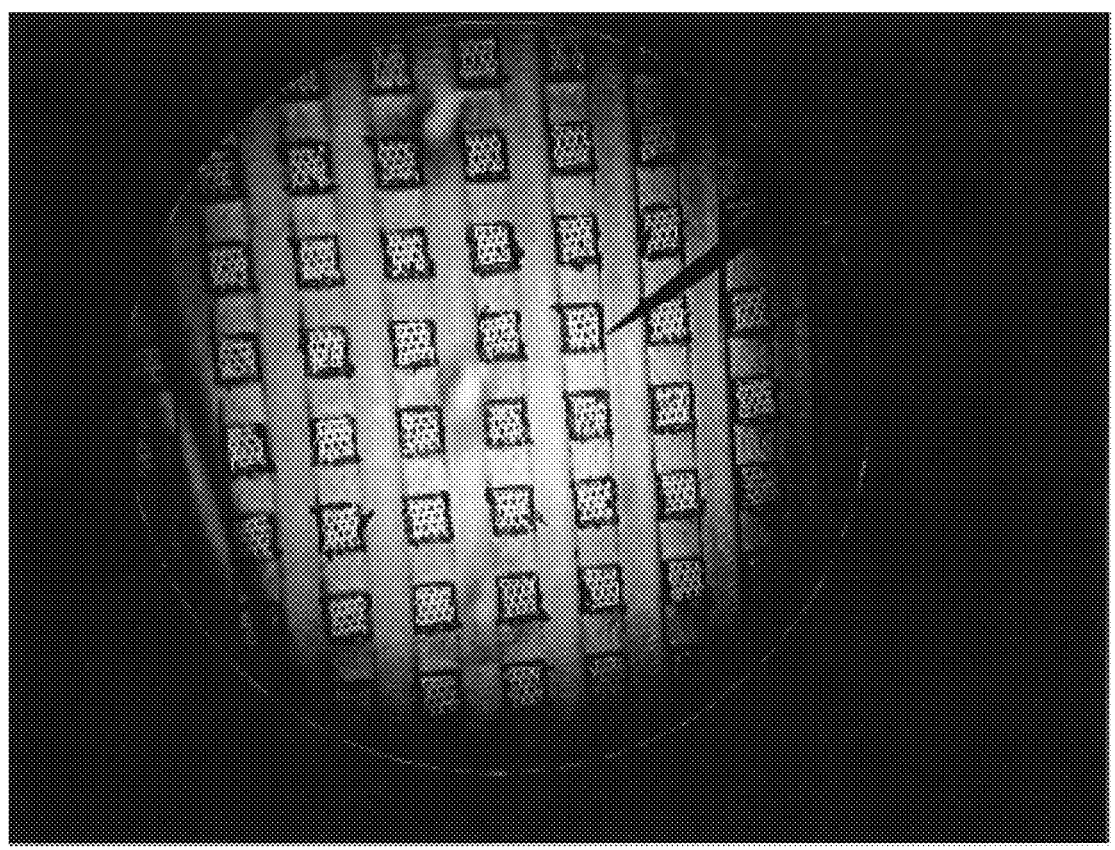

FIG. 23 depicts a particular embodiment of a polypropylene hierarchical microstructure device with the following dimensions:

| L3: | 10 um square | 20 um pitch | rectangular array | 25 μm height |
| L2: | 100 um square | 200 um pitch | rectangular array | 70 μm height |
| L1: | 100 um channels | 200 um pitch | parallel channels | 100 μm height |

DETAILED DESCRIPTION

The following description is an exemplification of the principles of the present disclosure and is not intended to limit the disclosure to the particular embodiments illustrated herein.

The microstructured surfaces and devices of the present application form adhesions to wet slippery surfaces which prevent or reduce shear translation. Microstructured devices of the present invention are devices with a hierarchically microstructured surface on at least one face of a device. Each hierarchical microstructure is to be designed to a particular application, as disclosed here for a number of particular embodiments designed to particular applications, for a device designed to prevent slippage on a wet slippery surface. When two solid surfaces form a liquid interface, surface texture plays a large role in the mobility of one surface with respect to the other. A scale of interaction between a microstructured surface and a deformable surface is defined by the surface texture of the microstructured device.

The microstructure is typically hierarchical, and characterized by at least two spatial scales, one on the order of 1-20 micrometers (microns) and another on the order of 10-1000 microns. In some embodiments, the microstructure comprises three spatial scales, one on the order of 1-20 micrometers (microns), another on the order of 10 to 500 microns, and another on the order of 100-10000 microns in width. In some embodiments, the spatial scales are on the order of 1-10 micrometers (microns), another on the order of 10 to 250 microns, and another on the order of 200-5000 microns in width. In some embodiments, the spatial scales are on the order of 1-10 micrometers (microns) in width, another on the order of 10 to 250 microns width, and another on the order of 200-1000 microns in width. In some embodiments, the microstructure comprises three spatial scales, one on the order of 1-20 micrometers (microns), another on the order of 10 to 500 microns, and another on the order of 100-10000 microns in height. In some embodiments, the spatial scales are on the order of 1-10 micrometers (microns), another on the order of 10 to 250 microns, and another on the order of 200-5000 microns in height. In some embodiments, the spatial scales are on the order of 1-10 micrometers (microns), another on the order of 10 to 250 microns width, and another on the order of 200-1000 microns in height.

In certain embodiments, the microstructures, respectively have pitches ranging from 1-20 micrometers (microns), another on the order of 10 to 500 microns, and another on the order of 100-10000 microns. In some embodiments, the spatial scales are on the order of 1-10 micrometers (microns), another on the order of 10 to 250 microns, and another on the order of 200-5000 microns. In some embodiments, the spatial scales are on the order of 1-10 micrometers (microns), another on the order of 10 to 250 microns width, and another on the order of 200-1000 microns.

It should be appreciated that in this disclosure the term hierarchical means microstructures of different spatial scale. A hierarchical microstructure is defined on a two-dimensional surface characterized by dimensions x and y, and out-of-plane dimension z. Each microstructure scale can be defined by characteristic dimensions x', y' and z' residing on a two-dimensional surface described by function f(x, y). Function f(x, y) is not necessarily planar. A hierarchical microstructure is a set of scaled microstructures, each characterized by (x', y', z'), (x", y", z"), and so on; wherein, a first microstructure resides in a region defined by (x, y, z1) and a second microstructure resides in a region defined by (x, y, z2), and so on. The range z1 spans a range of z values defined by zmin<z1<zmax, and so on. A hierarchical microstructure is a three-dimensional microstructure where most of the first microstructure resides in region z1, and most of the second microstructure resides in region z2, and so on, such that z1>z2> . . . with respect to an arbitrary set of Euclidean coordinates (x, y, z). For example, a hierarchical microstructure may comprise a set of cylinders of height 10 and diameter 2 arranged on the top surfaces of cylinders arranged in a plane of height 100 and diameter 20.

A hierarchical microstructure is self-similar if the ratio of feature dimensions scale by a constant factor. The self-similarity may occur in all of the scale dimensions, or any subset of the scale dimensions. In the example of cylinders, the pitch between cylinders at various spatial scales p1, p2, p3, . . . is self-similar, if the pitches satisfy the constant ratios p1/p2=p2/p3= . . . =c, where c is a constant. Pitch is defined as the distance between the centers of two like-structures. In most cases the pitch is constant for a given type of structure. Aspect ratio is a related measure, which is defined as the ratio of the height of a structure to its width.

When a Wenzel-Cassie state is developed between a microstructured device and a wet deformable surface and a shear force is applied, the deformable surface distorts into a shape called a wrinkle eigenmode. The term eigenmode refers to the discreteness of the possible geometries the distorted surface may take. If the shear force is sufficient the wrinkle eigenmode shape of the deformable surface transitions to a buckled state, and the microstructured device translates (slips) relative to the deformable surface. An object of the present invention is to prohibit or inhibit transition into the buckled state when a hierarchically microstructured device is placed on a wet deformable surface.

Split contact Wenzel-Cassie state refers to a multiplicity of Wenzel-Cassie states developed on a microstructured surface at different size scales. Split contact inhibits the transition from the wrinkle eigenmode state to the buckled state in the deformable surface.

Wrinkle eigenmode stabilization refers to microstructure designs which inhibit the transition from the wrinkle eigenmode state to the buckled state in the deformable surface. Wrinkle eigenmode stabilization is an important enabling aspect, and an object of the present invention, which allows one to match the microstructure of a microstructured device to a target deformable surface or class of target deformable surfaces. Intentional design of this kind is called designing to an application.

The interaction of a precursor film with a hierarchical microstructure leads to first-order transitions in contact structure, critical or continuous wetting transitions on solid surfaces, which are of both long-range and short-range character. The wetting of hierarchical microstructure is characterized by intermediate wetting states residing between the usual partial wetting and complete wetting regimes.

In the context of non-textured surfaces, the literature calls these intermediate wetting states "frustrated-complete wetting". The applicants have found that frustrated wetting, and the associated frustrated contact angles, are a common feature in microstructure hierarchically textured surfaces. In particular, saturated fatty acids adsorbed on water lead to pseudo-partial wetting. The condition of frustrated wetting is the result of opposing long-range van der Waals forces pinned on hierarchical levels. The London dispersion forces and the Debye dipole-non-polar forces compete in a subtle manner at the interfaces between hierarchically defined regions resulting in dynamical wetting transitions of saturated fatty acids in contact with water. Saturated fatty acids are not necessary to establish frustrated wetting regimes on hierarchical surfaces, but they are more common in the solid-lipid-water interface than in the solid-liquid-air interface.

Figure 1:
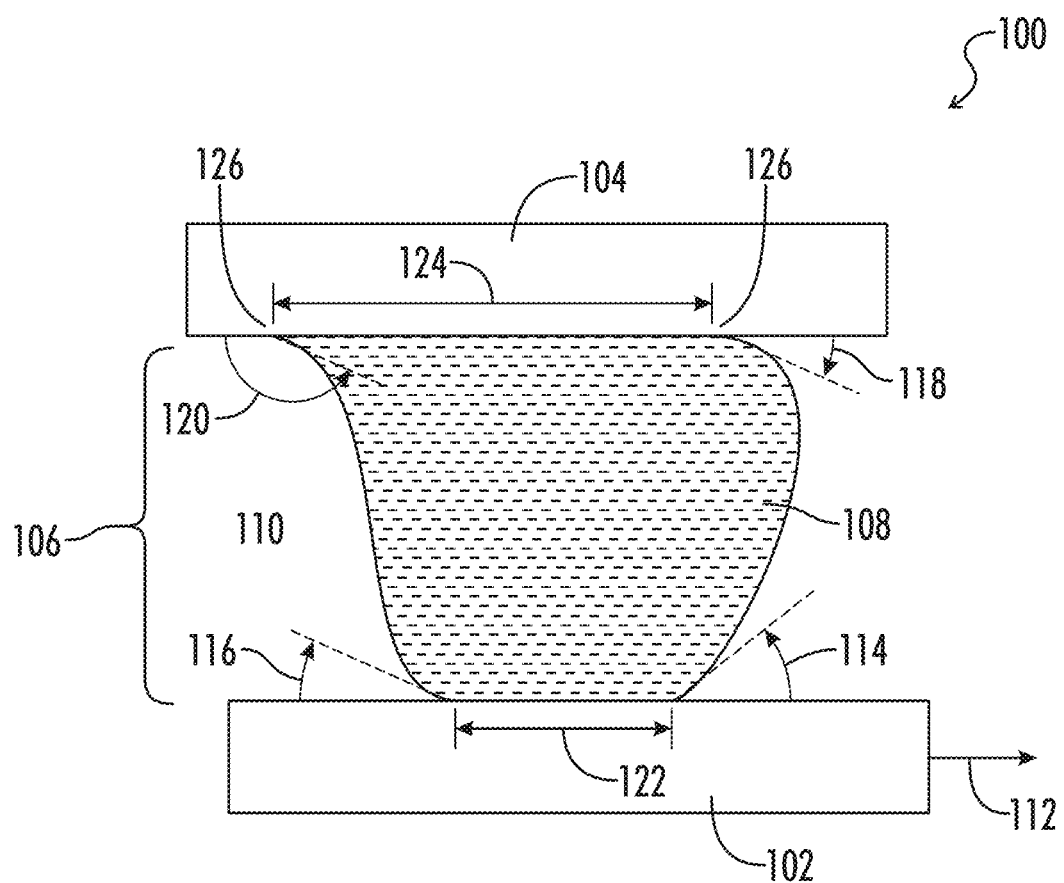
FIG. 1 illustrates the receding edge to relative to the advancing edge of a microstructured device in contact with a wet deformable surface under a translational force.

In order to intentionally design to a particular use, an object of the present invention, one must understand the theoretical aspects responsible for Wenzel-Cassie pinning, hierarchical pinning, and wrinkle eigenmode stabilization utilizing split contact Wenzel-Cassie geometries. In the following, each theoretical aspect is described in detail. The shear translational reluctance of the receding edge relative to the advancing edge of a microstructured device in contact with a wet deformable surface is illustrated in FIG. 1. In the description of FIG. 1 the contact angle is taken through a lipid phase. As such, in this description only, a small contact angle equates with hydrophobicity, contrary to the convention used to describe solid-water-air interfaces.

An infinitesimal displacement 100 involves a microstructured device 102, a deformable surface 104, and a wet interface 106 comprising hydrophilic phase 108 and hydrophobic phase 110. The hydrophilic phase 108 is typically an aqueous phase comprising water. The hydrophobic phase 110 may comprise air or a hydrophobic liquid such as a lipid. In this example, the hydrophobic phase is a lipid.

The microstructured device 102 is translated in direction 112 relative to deformable surface 104. As a consequence of displacement 112 the advancing contact angle 114 with the microstructured device 102 increases and receding contact angle 116 with the microstructured device decreases. Conversely, the advancing contact angle 118 with the deformable surface 104 decreases and the receding contact angle 120 with the deformable surface increases. The adhesivity between the interface 106 and either of the two surfaces 102 and 104 is proportionally related to the contact angles. A larger contact angle corresponds to a contact edge less likely to translate in the shear direction 112.

The contact angles 114 and 116 on the microstructured device 102 are less, respectively, than the corresponding contact angles 118 and 120 on the deformable surface 104. However, the smallest contact angle of all four contact angles is the advancing contact angle 118 on the deformable surface 104. Accordingly, the contact edge 126 will advance with respect to deformable surface 104, whereas the other contact edges will not advance. The fact that contact angle 118 is the smallest contact angle is a consequence of Wenzel-Cassie fluid pinning between the interface 106, the hydrophilic phase 108 in particular, and the microstructured device 102.

There is no Wenzel-Cassie fluid pinning between the deformable surface 104 and the interface 106. Therefore, the contact length 122 on the microstructured device 102 remains approximately constant under infinitesimal translation 112. On the other hand, contact edge 126 is translated with infinitesimal translation 112. The contact edge of the microstructured device 102 does not translate with infinitesimal translation 112. Therefore, the contact length 124 on the deformable surface 104 side increases under infinitesimal translation 112.

Now consider the effect on the deformable surface 104 when infinitesimal translation 112 returns to zero. Advancing contact angle 118 returns to a wetting value approximately equal to contact angle 120. However, now microstructured device contact length 122 is less than deformable surface contact length 124. The difference between length 122 and length 124 generates a compressional force and deformable surface 104 begins to wrinkle. This is the mechanism by which the wrinkle eigenmodes are formed; or alternatively in the extreme case, a buckling state forms, and the microstructure device 102 detaches from the deformable surface 104.

It should be noted, the contact angle is by convention measured through the denser phase. In FIG. 1, the contact angle is measured through the hydrophobic phase. However, if the hydrophobic phase is air, then the contact angle is measured through the aqueous phase. In the air-water interface case the contact angle is inversely related to the adhesivity. In FIG. 1, the adhesivity is proportionately related.

Accordingly, the deformable surface undergoes compression in the region contacted by the microstructured device. Compression of the deformable surface by infinitesimal displacement excites wrinkle eigenmodes in the deformable surface. If there is space at the interface between the wrinkled deformable surface and the microstructured device to accommodate the wrinkling of the deformable surface, then the microstructured device remains localized on the deformable surface. If the vertical cross section of the microstructured device does not accommodate these wrinkle eigenmodes, the wrinkle quickly evolves to a buckled state. The buckled state causes the microstructured device to detach from the deformable surface, and the resistance to shear translation decreases significantly.

It is for this reason that the larger scale microstructures of the present invention, for example a two dimensional sinusoidal microstructure with amplitude on the order of 100 or more microns, is critical in stabilizing the microstructured devices of the present invention. The smaller structures in the hierarchical structure of the device are on the order of 1 to 100 microns. The smaller structures are critical in creating a dynamical contact line which is responsible for the receding contact edges being more adhesive than the advancing contact edges, hence creating the wrinkle eigenmodes which the larger scale microstructures accommodate. It is the action of these hierarchical microstructures on one device that act in concert to produce the unexpected resistance to device shear translation of the present invention.

Figure 2:
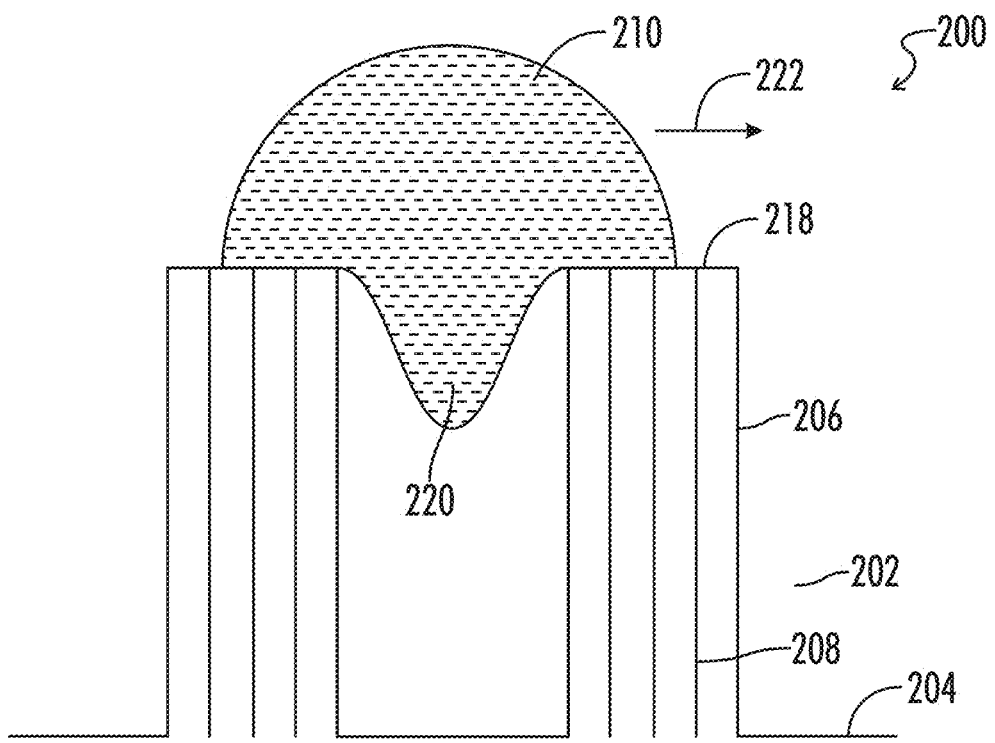
FIG. 2 depicts a Wenzel-Cassie pinning state on a microstructured device.

Referring to FIG. 2, an embodiment, a Wenzel-Cassie pinning state 200 on a microstructured device is depicted. A Wenzel-Cassie microstructure 202 comprising a substrate 204, and cylindrical pillars 206 on which are disposed fins 208. Wenzel-Cassie microstructure 202 is a hierarchical structure where the dimensional thickness and spacing (pitch) of fins 208 are smaller than the dimensional thickness and pitch of the pillars 206. FIG. 2 illustrates a drop of aqueous phase 210 Wenzel-Cassie pinned to the microstructure 202. Note, a Cassie-Baxter state is a state in which the aqueous phase 210 does not project into the interstitial space 212 between cylindrical pillars 206. A Wenzel state is a state in which the aqueous phase 210 is in contact with all surfaces of Wenzel-Cassie microstructure 202. A Wenzel-Cassie state is a contact state associated with a mixture of wetting and dewetting surfaces. A robust Wenzel-Cassie state is a contact state associated with two hierarchical microstructures which are both wetting, but the hierarchical structure prevents wetting of substrate 204. For example, FIG. 2 illustrates a robust Wenzel-Cassie state if the cylindrical pillar tops 218 and the fins 208 are substantially in contact with the aqueous phase 210. The spaces between cylindrical pillars 206 and the surface of substrate 204 are in contact with the hydrophobic phase, for example a lipid or air. The hydrophobic phase captures or resists shear translation 222 of the protrusion 220 of the aqueous phase 210. The juxtaposition of hydrophobic and hydrophilic phases in a Wenzel-Cassie state results in Wenzel-Cassie pinning.

Figure 3:
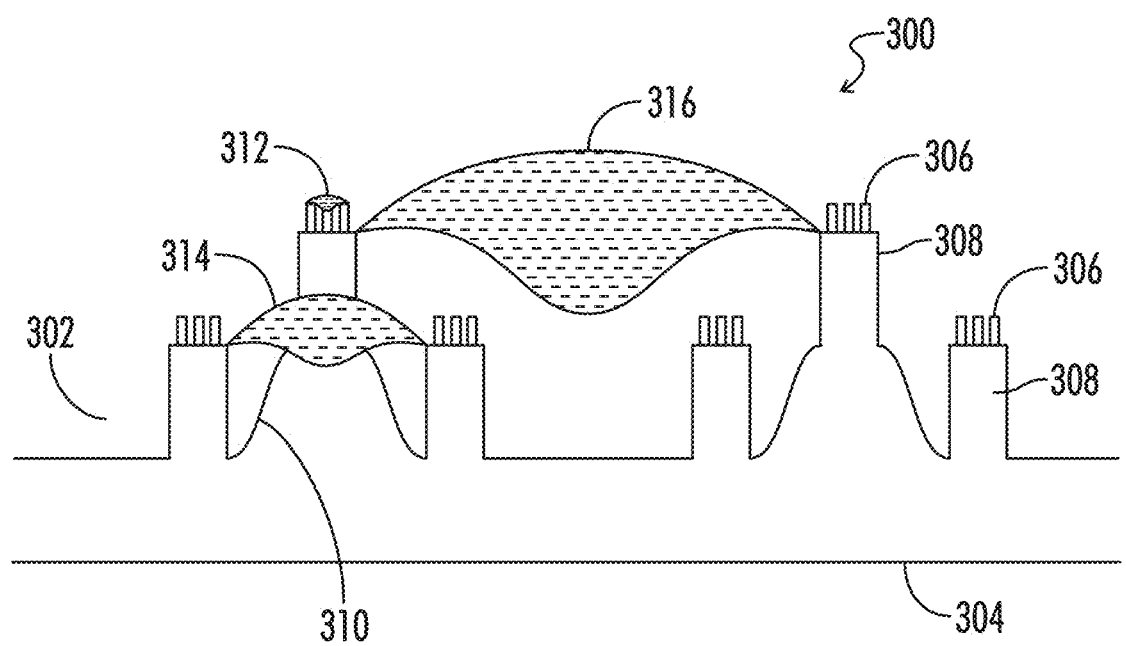
FIG. 3 depicts a hierarchical Wenzel-Cassie pinning state in the absence of infinitesimal translation.

Referring to FIG. 3, an embodiment, a hierarchical Wenzel-Cassie pinning state 300 is depicted in the absence of infinitesimal translation. A stacked hierarchical Wenzel-Cassie microstructure 302 comprises a substrate 304, first level cylindrical pillars 306, second level cylindrical pillars 308, and third level sinusoid 310. The wetting evolves temporally from first Wenzel-Cassie state 312, to second Wenzel-Cassie state 314, and to third Wenzel-Cassie state 316.

The order of progression, from larger structures to smaller structures, or conversely, or any combination, depends on a number of factors, including the composition of the structures, their shape, their spacing, the composition of the interface, and the like. In an embodiment, the contact between hydrophilic phase and hydrophobic phase is temporally evolving through this interfacial evolution. Even when the depicted configuration of contact state is reached, thermal fluctuations, fluidic motion and the like can continuously be changing the contact surface between hydrophilic and hydrophobic phases.

Temporal evolution of the contact state, and consequently contact angle at each hierarchical level, is defined here as contact angle confusion. Contact angle confusion distinguishes hierarchical fluid pinning from Wenzel-Cassie fluid pinning. When a force is applied, the contact angles align in the direction of the applied force. In Wenzel-Cassie pinning, once shear translation is initiated the contact angles change to facilitate continued shear translation. However, in the case of hierarchical pinning, the contact angles cannot organize as efficiently in the direction of the applied force and consequently the stochastic changes to contact angles inhibit continued shear translation. In some cases, the act of supplying energy through translation can increase the amount of force necessary to continue shear translation.

Figure 4:
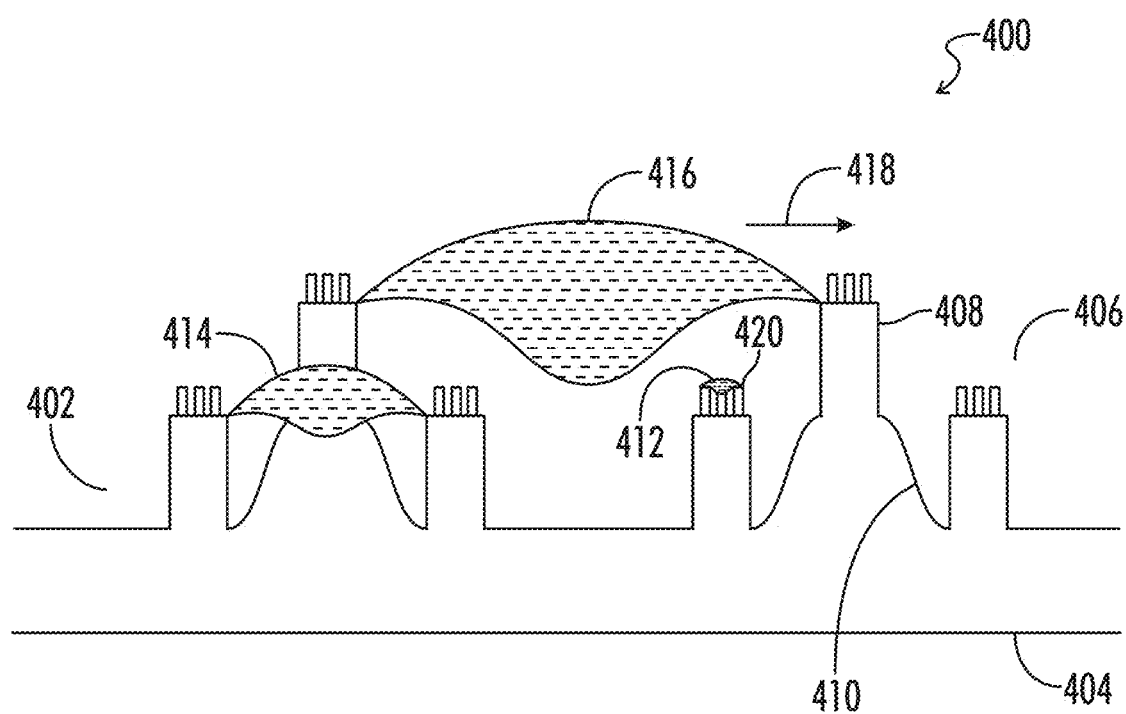
FIG. 4 depicts a hierarchical Wenzel-Cassie pinning state in the presence of infinitesimal translation.

Referring to FIG. 4, an embodiment, a hierarchical Wenzel-Cassie pinning state 400 is depicted in the presence of infinitesimal translation. A hierarchical Wenzel-Cassie microstructure 402 comprising a substrate 404, first level cylindrical pillars 406, second level cylindrical pillars 408, and third level sinusoid 410. Assume the wetting state evolution of FIG. 3 is in a quasi-stable wetted state, depicted by first Wenzel-Cassie state 412, second Wenzel-Cassie state 414, and third Wenzel-Cassie state 416. A force is applied in direction 418. The infinitesimal translation of Wenzel-Cassie state 412 breaks the static Wenzel-Cassie pinning, and Wenzel-Cassie state 412 transitions to Wenzel-Cassie state 418. Wenzel-Cassie pinning is relatively weak compared to hierarchical pinning. The transition from state 412 to state 418 requires relatively little reorganization of the contact surfaces and associated angles. However, translating the Wenzel-Cassie state 412 to the Wenzel-Cassie state 420 effectively destroys Wenzel-Cassie state 412. The resulting constituents enter a mixed phase which absorbs some of the kinetic energy supplied by the infinitesimal translation 418. The mixed phase eventually separates into Wenzel-Cassie states again, but this changes all the contact angles. Since there is only one set of contact angle alignments that promotes shear translation, the net effect is to inhibit continued shear translation.

The condition where Wenzel-Cassie states form on spatially distinct levels is called Wenzel-Cassie split contact, and it is in some ways analogous to the mechanical split contact responsible for the adhesion of the Gecko foot to a surface. Clearly, when the Wenzel-Cassie split contact is hierarchical, shear translation is robustly inhibited. For example, disruption of Wenzel-Cassie state 416 absorbs a significant amount of translational energy. However, if the shear force is sufficiently large to disrupt all the static Wenzel-Cassie pinning states, adhesion is substantially lost.

Figure 5:
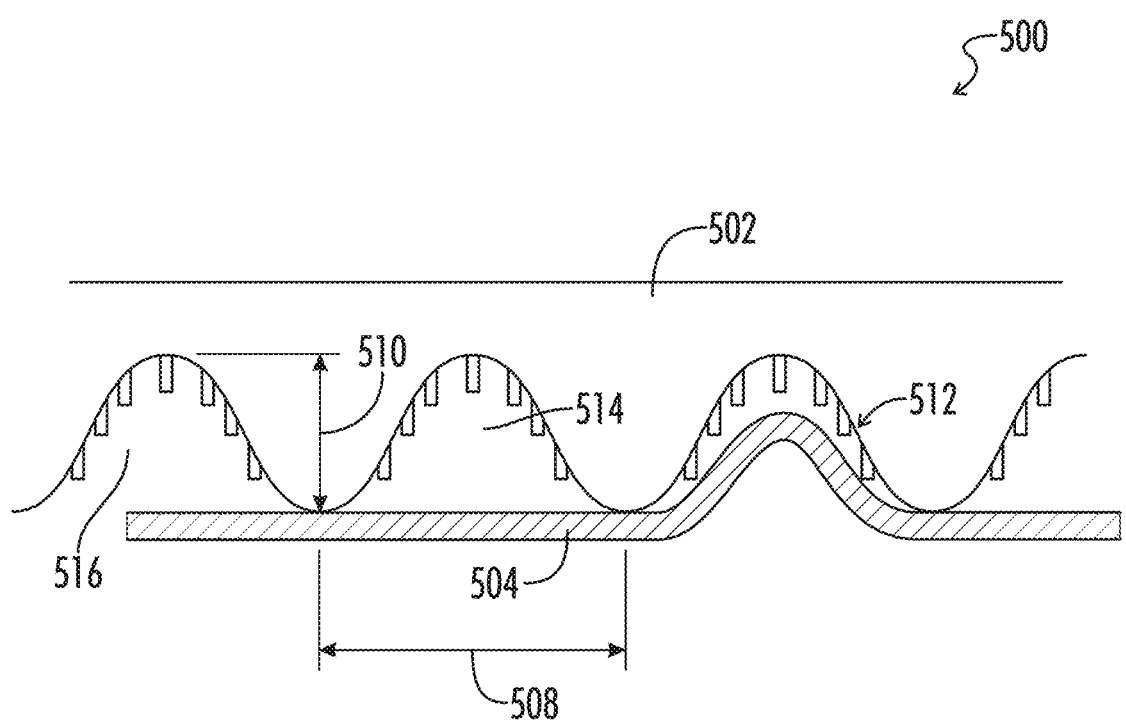
FIG. 5 depicts wrinkle eigenmode stabilization involving a microstructured device in contact with a deformable surface.
Figure 6A:
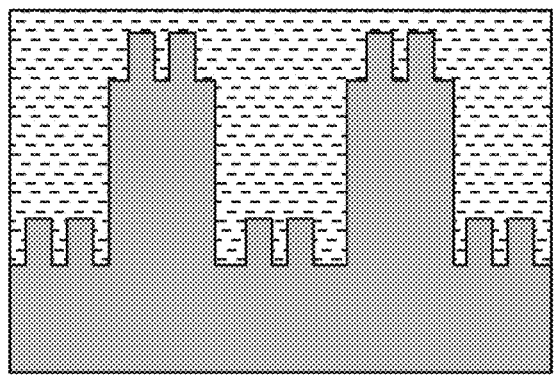
FIGS. 6A, 6B, 6C and 6D depict Class I microstructures with first and second scale microstructures with their long axes co-parallel.
Figure 6B:
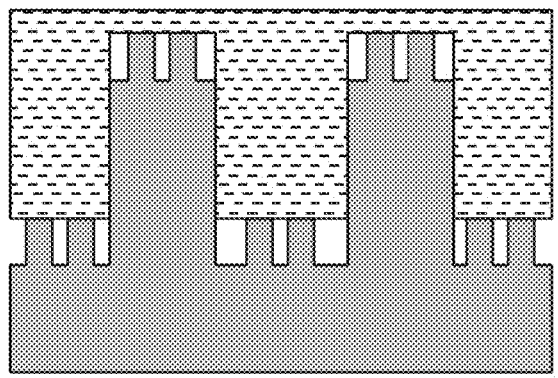
Figure 6C:
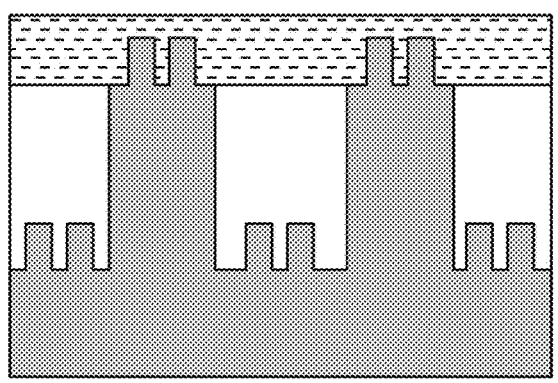
Figure 6D:
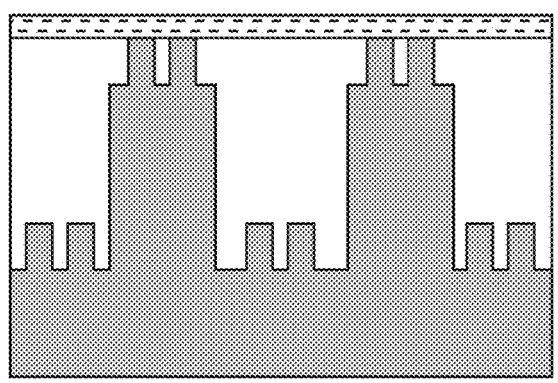
Figure 7A:
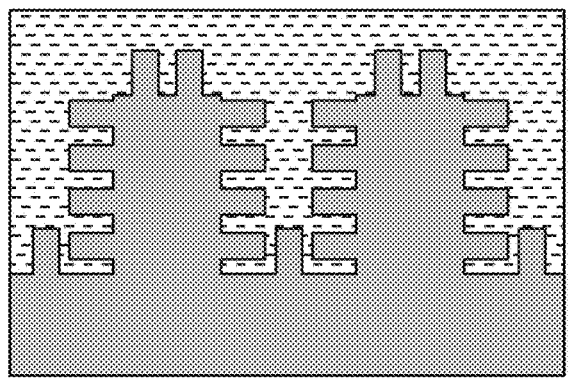
FIGS. 7A, 7B, 7C and 7D depict Class II microstructures with first and second scale microstructures with their long axes oriented orthogonally.
Figure 7B:
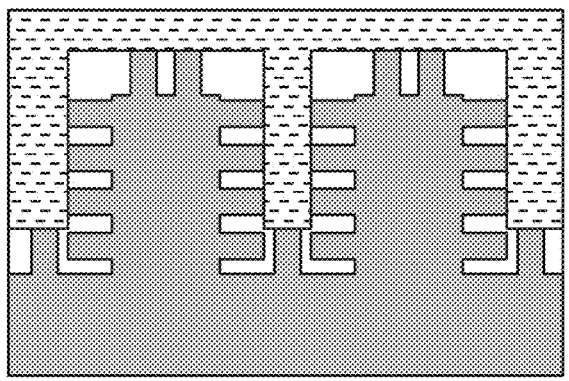
Figure 7C:
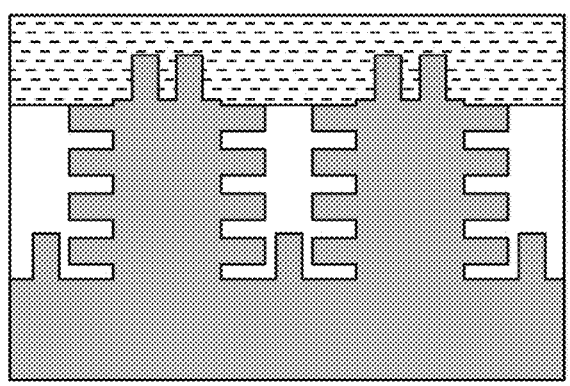
Figure 7D:
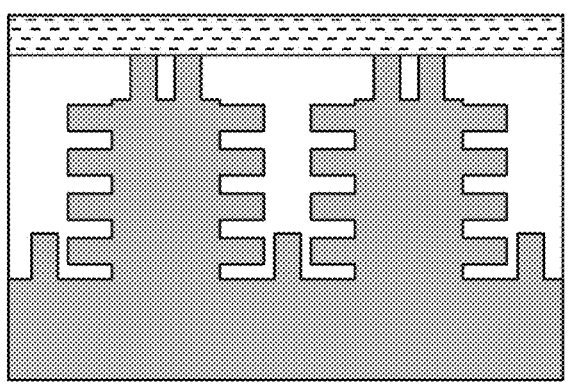

Referring to FIG. 5, an embodiment, a wrinkle eigenmode stabilization mode 500 involving a microstructured device 502 in contact with a deformable surface 504, is depicted. In general, a deformable surface under compression will compress until the compression energy is sufficient to cause the deformable surface 504 to enter one of its wrinkle eigenmodes 506. If hierarchical period 508 and amplitude 510 is insufficient to accommodate wrinkle eigenmode 506, the wrinkle eigenmode 506 will quickly evolve into a buckled state. When the hierarchical period 508 or amplitude 510 is between the accommodation requirement and the flat state (spontaneous buckling or spontaneous slippage), the Shallamach condition is obtained, which results in a temporal series of slippage and grabbing events. Wrinkle eigenmode stabilization 512 proceeds in steps in the case of Shallamach wave generation. As the compression builds in the deformable surface 504, the deformable surface successively deforms into spaces 514 and 516 (higher eigen modes). As the compression spreads through the deformable surface 504, higher wrinkle eigenmodes are excited where the order of the eigenmode is the number of wrinkles excited. Since the compression needed to create a buckled state is higher than the compression needed to excite an eigenmode, the microstructured device 502 actively suppresses transition to the buckled state.

For most deformable surfaces, it is sufficient to tune only the large scale microstructure of the microstructured device to the flexural spatial period of the target deformable surface. Methods for determining the flexural spatial period are known in the art using the impulse excitation technique. An embodiment is a hierarchical microstructure device in which the largest scale microstructure is tuned to a wrinkle eigenmode.

Of special interest is the buckling wavelength of skin, which ranges from 50 to 200 microns given the range of Young's modulus for skin is in the range 25-100 kPa. Therefore, any large scale microstructure with a pitch greater than 200 microns is sufficient to stabilize a microstructured device against buckling on skin. Greater hierarchical pinning will occur for pitch closer to 50 microns, assuming the amplitude of the large scale microstructure is in the range 50-200 microns.

An embodiment is a hierarchical microstructure device in which the largest scale microstructure is tuned to a wrinkle eigenmode of skin.

Topological Design Considerations

The term hierarchical microstructure takes several distinct topological forms. Stacked hierarchical forms useful in the present invention are illustrated in FIGS. 6 and 7. A Wenzel-Cassie wetting state is unique to hierarchical structure. On simple 1-level microstructures, the wetting states are restricted to Wenzel or Cassie-Baxter wetting states. Accordingly, a generalized Wenzel-Cassie wetting state comprises combinations of Wenzel and Cassie-Baxter states on any of the distinct hierarchical levels.

In FIGS. 6 and 7, general embodiments, 2-level microstructures of Wenzel, Cassie-Baxter, and Wenzel-Cassie wetting states are illustrated with the understanding that any combination of these wetting states that involves at least one Wenzel and at least one Cassie-Baxter wetting state suffices as a Wenzel-Cassie state.

There are two general classes of 2-level microstructures. The first class, illustrated in FIG. 6, comprises microstructures in which the first and second scale microstructures have their long axes co-parallel. The second class, illustrated in FIG. 7, comprises microstructures in which the first and second scale microstructures have their long axes oriented orthogonally.

Referring to FIG. 6, hierarchical microstructures of Class I take four principal forms. FIG. 6A is a Wenzel wetting state. FIG. 6B is a Wenzel-Cassie wetting state, with a Wenzel state on Level 1 and a Cassie-Baxter state on level 2. FIG. 6C is a Wenzel-Cassie wetting state, with a Cassie-Baxter state on Level 1 and a Wenzel state on Level 2. FIG. 6D is a Cassie-Baxter wetting state.

Referring to FIG. 7, hierarchical microstructures of Class I take four principal forms. FIG. 7A is a Wenzel wetting state. FIG. 7B is a Wenzel-Cassie wetting state, with a Wenzel state on Level 1 and a Cassie-Baxter state on level 2. FIG. 7C is a Wenzel-Cassie wetting state, with a Cassie-Baxter state on Level 1 and a Wenzel state on Level 2. FIG. 7D is a Cassie-Baxter wetting state.

Contact Angle Design Considerations

In general, the static Wenzel-Cassie pinning strength is a function of the difference between the contact angles at Level 1 and level 2. The contact angle for a Cassie-Baxter 1-level microstructure utilizing cylindrical pillars can be characterized by the pitch and diameter of the pillars. The contact angle for Cassie-Baxter wetting does not depend on the aspect ratio. A survey of the literature provides the following changes in contact angle relative to the contact angle for a flat sheet of the microstructure material. Positive values indicate the microstructure is less wetting relative to no microstructure. Referring to Table 1, column labels indicate the pitch, and rows labels indicate the pillar diameter, both given in microns.

TABLE 1

|    | 10 | 15 | 20  | 25  | 30  | 35  | 40  |
|----|----|----|-----|-----|-----|-----|-----|
| 5  | +6 | +9 | +18 | +27 | —   | —   | —   |
| 10 | —  | -5 | +5  | +13 | +20 | —   | —   |
| 15 | —  | —  | -5  | +4  | +11 | +18 | —   |
| 20 | —  | —  | —   | -4  | +3  | +10 | +16 |

In general, the static Wenzel-Cassie pinning strength is a function of the difference between the contact angles at Level 1 and level 2. The Wenzel wetting state is included in design consideration by considering the 2-level structures of FIGS. 6 and 7. The contact angle for hierarchical 2-level microstructures utilizing cylindrical pillars can be characterized by the pitch and diameter of the pillars for a 3:1 aspect ratio on both levels. Due to the lack of experimental data for contact angles on hierarchical structures, theoretical values will be given. Positive values indicate the microstructure is less wetting relative to no microstructure. Referring to Table 2 and Table 3, theoretical values of contact angle are given for the microstructures of FIG. 6 and FIG. 7, respectively. Diameter and pitch values are given in microns.

TABLE 2

| Diameter X pitch | θωω | θωc | θcω | θcc |
|---|---|---|---|---|
| 5 X 10 | +71 | +71 | +47 | +47 |
| 5 X 15 | +46 | +71 | +47 | +51 |
| 5 X 20 | +30 | +71 | +53 | +56 |
| 5 X 25 | +34 | +71 | +57 | +59 |

TABLE 3

| Diameter X pitch | θωω | θωc | θcω | θcc |
|---|---|---|---|---|
| 5 X 10 | +71 | +71 | +47 | +47 |
| 5 X 15 | +71 | +71 | +47 | +51 |
| 5 X 20 | +45 | +71 | +53 | +56 |
| 5 X 25 | +32 | +71 | +57 | +59 |

It can be seen from Tables 2 and 3 that hierarchical structures are almost always superhydrophobic, the flat contact angle being typically in the range of 90 to 110 degrees. A superhydrophobic microstructure is a microstructure with a contact angle greater than 150 degrees, and adding the values found in Tables 2 and 3 to a 110 degree baseline yields superhydrophobic contact angles.

A feature of microstructured devices comprising hierarchical structure is that two or more superhydrophobic states can coexist on one microtextured hydrophobic substrate. For moderately hydrophobic substrates, the Cassie-Baxter regime of air-trapping or lipid-trapping is often observed to be metastable. By applying pressure to the liquid interface between microstructured device and deformable surface, it is possible to induce an irreversible transition from the Cassie-Baxter state to the Wenzel state. The surprising observation is that the contact angles in both states are comparable. The Wenzel contact angle is usually slightly smaller than the Cassie-Baxter contact angle. However, the wetting state transformation dramatically changes the contact angle hysteresis. It is the magnitude of the contact angle hysteresis that is most important in determining resistance to shear translation.

An embodiment is a hierarchical microstructure device in which the contact surfaces internal to the interface between device and surface is metastable.

For metastable Cassie-Baxter states, it has been found that the contact angle hysteresis in the Wenzel wetting state is 10 to 20 times larger than the contact angle hysteresis in the Cassie-Baxter wetting state. The metastable character of superhydrophobic hierarchical microstructures allows for high contact angle hysteresis, contrary to the conventional expectation for superhydrophobic surfaces.

The above observation suggests that it is the internal contact angles, or contact surface topologies, that determine the difference in the advancing and receding contact angles at the leading and trailing edges of the microstructured device. For this reason, selecting scaled microstructures that provide large differences in contact angles between hierarchical levels, provides a practical guide to enhancing contact angle hysteresis, even though, as seen above, such a choice has little effect on the static contact angles at the leading and trailing edges of the microstructured device.

The metastability of hierarchical microstructure interfaces explains the observation that the act of applying force to a microstructured device in order to shear translate the microstructured device over a wet deformable surface often leads to enhanced resistance to shear translation.

An embodiment is a hierarchical microstructure device, which when in contact with a wet deformable surface, increases the force required for shear translation after an initial infinitesimal shear force is applied.

In certain architectures, where contact of the microstructured device to the wet deformable surface leads to evolution of the wetting state, the action of wicking across the hierarchical levels of the microstructured device leads to a normal force sufficient to induce split contact Wenzel transitions.

In an example embodiment, the applicants have discovered that the act of grasping a wet container with a metastable hierarchically microstructured surface essentially locks the container to the hand regarding shear translation. Translation orthogonal to the container surface, i.e., loosening the grip, is unaffected by the microstructured surface of the container.

In another example embodiment, the applicants discovered that a sheet-form surgical implant intended to block post-surgical adhesions comprising a metastable hierarchical microstructure appears to suck down on tissue in the absence of normal force. After the split contact Wenzel transition has occurred, shear translation of the implant is essentially blocked. Clearly, for the split contact Wenzel transition to occur in the absence of normal force, the stiffness of the microstructured device must be sufficiently small so as not to counteract the induced normal force.

Extreme wetting on superhydrophobic surfaces requires many underlying microscopic length scales, which the applicants have discovered impact macroscopic properties and also lead to complex energy landscapes and contact-line dynamics.

The Role of Self-Similarity in Metastable Hierarchical Designs

Survey of the literature reveals most complex multi-scale microstructure fabrication methods yield surface roughness that conforms to a continuous spectrum of size and pitch scales. A critical design feature for the functionality of the present invention is that a split contact Wenzel-Cassie wetting state be obtained when the microstructured surface comes in contact with a wet deformable surface.

The split contact Wenzel-Cassie condition can only be achieved in the case where the spectrum of sizes and pitch is not continuous. In fact, the discontinuity of the size and pitch spectrum is an invariant feature of hierarchical microstructures. A refinement on the split contact concepts, is that the size and pitch features be related to one another in a constant ratio. In this case, the scaled features of the hierarchical microstructure are self-similar. The choice of the self-similarity constant depends on the target deformable surface.

An embodiment device comprises hierarchical microstructure wherein each hierarchical level comprises a characteristic range of spatial periodicity, and the range of spatial periodicity of each hierarchical level contains no spatial period comprising the range of spatial periodicity of the other levels.

Yet the consequences of the presence of discretely separated different length and pitch scales in superhydrophobic materials has been almost unexplored in the literature. In particular, the impact of hierarchical structure on the interfacially driven transport of wetting states has been completely ignored.

One field of application in which hierarchical self-similarity plays an important role is in the field of thermal insulation. Superhydrophobic self-similar hierarchically microstructured surfaces act as strong thermal insulators. In this application, metastability of the Cassie-Baxter wetting state works against the intended use. In this application, one wishes to stabilize the Cassie-Baxter wetting states. In this application, Table 1 is of particular utility. By utilizing Table 1 in a self-similar configuration, there is no weak-point in the hierarchical structure that would lead to a propagating Wenzel state.

It should be appreciated that the self-similarity concept works in both directions, if scale separation is sufficient to block Wenzel state propagation self-similarity promote Cassie-Baxter stability. If the scale separation is small enough to promote Wenzel state propagation, then self-similarity ensured the Wenzel state is not blocked at an intermediate scale blocking the Wenzel saturation on all scales.

In the thermal insulation application, an embodiment, the objective is to obtain a state in which the liquid interface is supported by the tips of the hierarchical features such that the features act as thermally isolating bridges. In this application, the microstructure is on the inside of the container. Practical uses range from the insulation of a coffee cup to the insulation of cryogenic fluid conduits.

Self-similarity applied in the opposite direction, where thermal conductivity is desired, an application in the field of heat exchangers and vapor cooling can be appreciated. Superhydrophobic materials can act as super-nucleating interfaces. Indeed, superhydrophobicity favors dropwise condensation at the tops of the hierarchical texture scales. The condensing droplets roll off easily, leading to strongly enhanced heat transfer. Despite these and many other potential applications, such as the cooling of electronic devices, the present disclosure provides the fundamental understanding necessary to enhance heat transfer at superhydrophobic surfaces. An embodiment is a hierarchical microstructure device which promotes heat transfer by condensation nucleation.

Self-similarity is particularly useful in applications where degradation of the microstructured surface is expected. Self-similarity ensures that if the top layer of the microstructured device is removed, the layers below will inherently share the same ratios of size and pitch. This ensures that the anti-slip properties of the surface remain unchanged through its thickness.

An embodiment is a hierarchical microstructure device with self-similar hierarchical structure wherein degradation of the pattern insignificantly affects the wetting characteristics of the device.

Materials Design Considerations

Useful polymers for fabricating microstructured devices of the present invention include, but are not limited to: PDMS, PMMA, PTFE, polyurethanes, Teflon, polyacrylates, polyacrylates, thermoplastics, thermoplastic elastomers, fluoropolymers, biodegradable polymers, polycarbonates, polyethylenes, polyimides, polypropylene, polystyrenes, polyvinyls, polyolefins, silicones, natural rubbers, synthetic rubbers and any combination of these.

In some embodiments, the microstructured surface, including the substrate and/or micro features disposed thereon, comprise an industrial material derived from animals and/or plants, for example a material comprising carbohydrates, cellulose, lignin, sugars, proteins, fibers, biopolymers and/or starches. Exemplary plant and/or animal derived industrial materials include, but are not limited to: paper; cardboard; textiles, such as wool, linen, cotton or leather; bioplastics; solid biofuels or biomass, such as sawdust, flour or charcoal; and construction materials, such as wood, fiberboard, linoleum, cork, bamboo and hardwood.

In certain embodiments, the microstructured surface comprises a composite material. For example, the microstructured surface, including the substrate and/or micro features disposed thereon, can comprise two or more distinct materials, layers and/or components.

In an embodiment, the microstructured surface comprises a coating on and/or over the plurality of microstructures. Useful coatings include, but are not limited to: fluorinated polymers, fluorinated hydrocarbons, silanes, thiols, and any combination of these. In various embodiments, the microstructured surface undergoes a step of processing the surface. Useful surface processing methods include, but are not limited to curing, cooking, annealing, chemical processing, chemical coating, painting, coating, plasma processing and any combination of these. Coatings Vs Microstructures It has been unexpectedly discovered that a hierarchical microstructured device where the terminal level has been replaced by a smooth hydrophilic substance exhibits Wenzel-Cassie behavior in contradiction with classical wetting models. Indeed, substitution of geometrically induced hydrophilicity with chemical hydrophilicity is applicable at any microstructure level, and conversely. For example, a smooth hydrophobic substrate coated in regions with a smooth hydrophilic substance can act as pinning sites for Wenzel-Cassie states residing on a hierarchical microstructure residing on the substrate.

In an embodiment, the hierarchical microstructure device is made more resistant to environmental degradation by replacing the fine structured terminal level with a coating possessing a hydrophilicity or oleophilicity distinct from another microstructure level.

The microstructured hierarchical surfaces of the present disclosure include those that can be terminally functionalized by any suitable and/or desirable means. For example, the desired regions near the tips of the superhydrophobic surface of a microstructure hierarchical surface can be functionalized with any desired groups, such as groups that are capable of electrostatic, covalent, hydrogen bonding, and/or van der Waals interactions.

In one embodiment, surface structures having a terminal fine structure can be functionalized by adhesion with surface groups that replace the fine structure with a smooth surface with a specific chemical hydrophilicity. Thus, replacing geometric hydrophilicity with chemical hydrophilicity.

In certain embodiments, the raised surface structures of the hierarchical microstructured device can be functionalized in a variety of ways to provide a surface for precipitation, adsorption or deposition of material from solution to occur.

In one embodiment, a raised surface structure can be treated to deposit a layer of gold, which can then be reacted with a variety of materials, e.g., hydrophobic thiol compound, to form a hydrophobic surface. Exemplary thiolated molecules include poly(styrene-co-2,3,4,5,6-pentafluorostyrene-SH), poly(methyl methacrylate-co-pentafluorooctyl methacrylate-SH), but in general any fluorinated or methylated thiol can be utilized.

In another embodiment, the tips of the raised surface structure can be further selectively functionalized by contacting the thiol-treated surface with a solution that contains another compound having the desired surface properties. Some exemplary molecules include carboxylic acid-terminated thiols, sulfonated thiol molecules, hydroxyl-terminated thiols, PEG-terminated thiols, and the like.

These treatments are not new, but the idea of terminating a hierarchically microstructured device with such treatments to obtain a non-slip superhydrophobic surface is a novel discovery of the applicants. Augmenting the non-slip features potentiated by superhydrophobic hierarchical surfaces is counter to the majority of non-stick applications associated with the concept of superhydrophobicity. The strength of the repellent feature in superhydrophobic surfaces is the same mechanism that strongly locks the Wenzel-Cassie wetting states in plane within the interior of interface volume.

Generically, embodiments are anticipated that replace geometrically hydrophilic/hydrophobic terminal structures by chemically hydrophilic/hydrophobic smooth surfaces. Doing so makes such hierarchical microstructured devices more mechanically robust by elimination of small scale features that may not reproduce well or degrade with use.
Water-Air Vs Water-Lipid Interface Design Considerations Because hydrophobic interactions increase in strength with increasing temperature, they are often viewed as entropic; that is, hydrophobic units induce some order in the surrounding water. This idea is correct inasmuch as small hydrophobic units reduce the volume of configuration space available for hydrogen bonding.

Hydrophobic molecules interact with water in a variety of ways in addition to excluding volume. They exert weak attractive forces on water molecules by means of van der Waals interactions. They also exert strong attractive forces via hydrophilic components, such as the hydroxyl group on an alcohol. Although van der Waals interactions are too weak to affect the existence of interfaces in water, they do affect the position of an interface. Similarly, whereas hydrophilic parts of amphiphilic molecules are not directly responsible for hydrophobic assemblies, they do affect the arrangement of these assemblies relative to interfaces and other structures.

In an embodiment, a hierarchical microstructure device utilizes the water organizing aspects of a solid-oil-water interface in a split contact Wenzel-Cassie configuration to inhibit site to site hopping. While air inhibits site to site hopping as well, lipids are incompressible, and their organizing attributes tend to fix water-solid interface equilibrium structures.

Importantly, the applicants have found that hydrophilic and oleophilic surfaces (solid-air-water interface and solid-air-oil interface) can switch into an oleophobic surface in water (solid-water-oil interface).

In an embodiment, an oleophilic-to-oleophobic transitioning hierarchical microstructured device is applied to surfaces exposed to environmental oil-rich contamination. For example, parts of vehicles which during their use accumulate oil residue and said surface, when periodically exposed to rain, transition to a self-cleaning mode. Ordinarily, such oil residues are resistant to cleaning treatments involving water.

Figure 8:
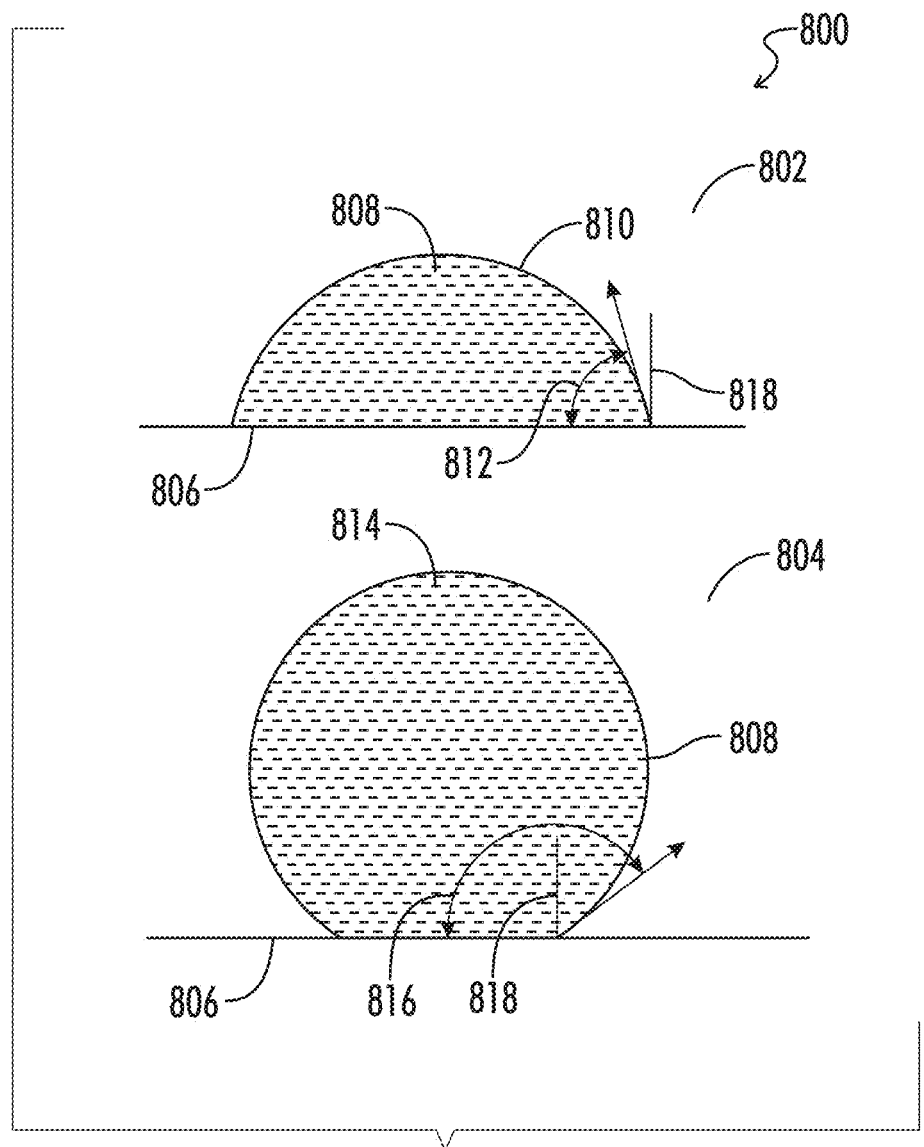
FIG. 8 depicts differences between a solid-water-air interface and a solid-oil-water interface.

Referring to FIG. 8, differences between and a solid-water-air interface 802 and a solid-oil-water interface 804 are illustrated. The solid 806—water 808—air 810 contact angle 812 and solid 806—oil 814—water 808 contact angle 816 are illustrated. If the angle is measured about the vertical axis 818, the solid-water-air contact angle 812 is the opposite sign and same magnitude as the solid-oil-water contact angle 816. This means, if a surface is hydrophilic in a solid-water-air interface, then the surface is both oleophilic and oleophobic in the solid-oil-water interface. Whether the microstructure surface is oleophilic or oleophobic depends on the surface energy. The same is true for a hydrophobic surface at a solid-water-air interface. The bistable nature of the oleophilic/phobic interface is a contributing factor in the metastability of the complex internal contact line dynamics.

In an embodiment, a hierarchical microstructured device possesses a surface energy configuration that is close to the oleophilic/oleophobic transition, and develops an interface with a deformable surface with extreme instability. Translational perturbations cause the metastable state to lock in one of the stable transition modes.

Design of these embodiments is enabled by Table 4. For an array of 15 micron diameter, and 30 micron height pillars the theoretical change in contact angle as a function of pitch is given in Table 4.

TABLE 4

| Pitch (microns) | water-air contact angle | oil-water contact angle |
| --- | --- | --- |
| 21 | +74 | +37 |
| 23 | +79 | +42 |
| 26 | +84 | +46 |
| 35 | +35 | +6 |
| 70 | +17 | +2 |
| 105 | +11 | −2 |
| 126 | +7 | −4 |
| 168 | +5 | −5 |
| 210 | +4 | −5 |

Topological Considerations at Hierarchical Levels

Figure 9:
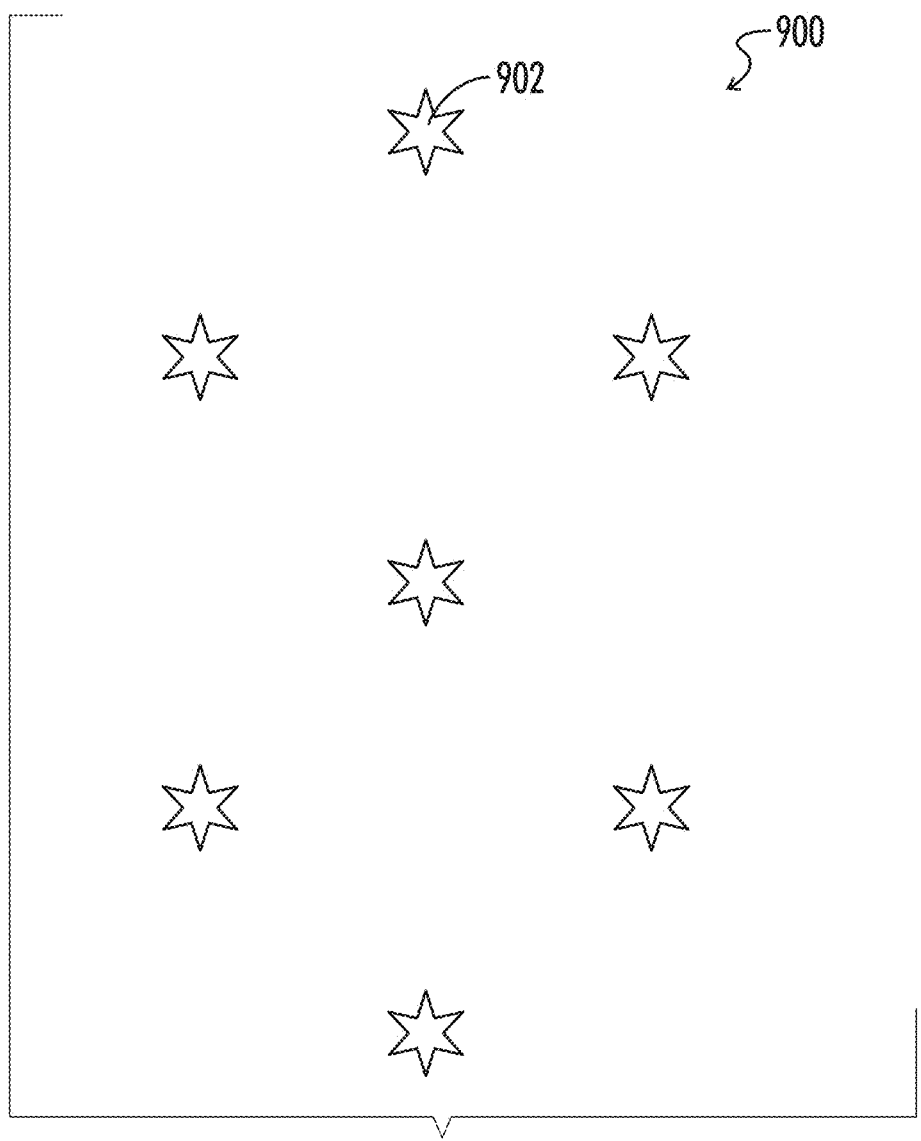
FIG. 9 depicts an embodiment of a microstructured surface comprising fluted columns in a triangular packing scheme in a planar array, where the columns are the L1 level and the flutes are the L2 level.

Visualizing the hydrophilic/hydrophobic contact surfaces within the interaction volume can beneficially guide design. Consider now a particular embodiment comprising fluted columns 902 in a triangular packing scheme in a planar array, where the columns are the L1 level and the flutes are the L2 level. FIG. 9 is a top view of the column array.

Figure 10:
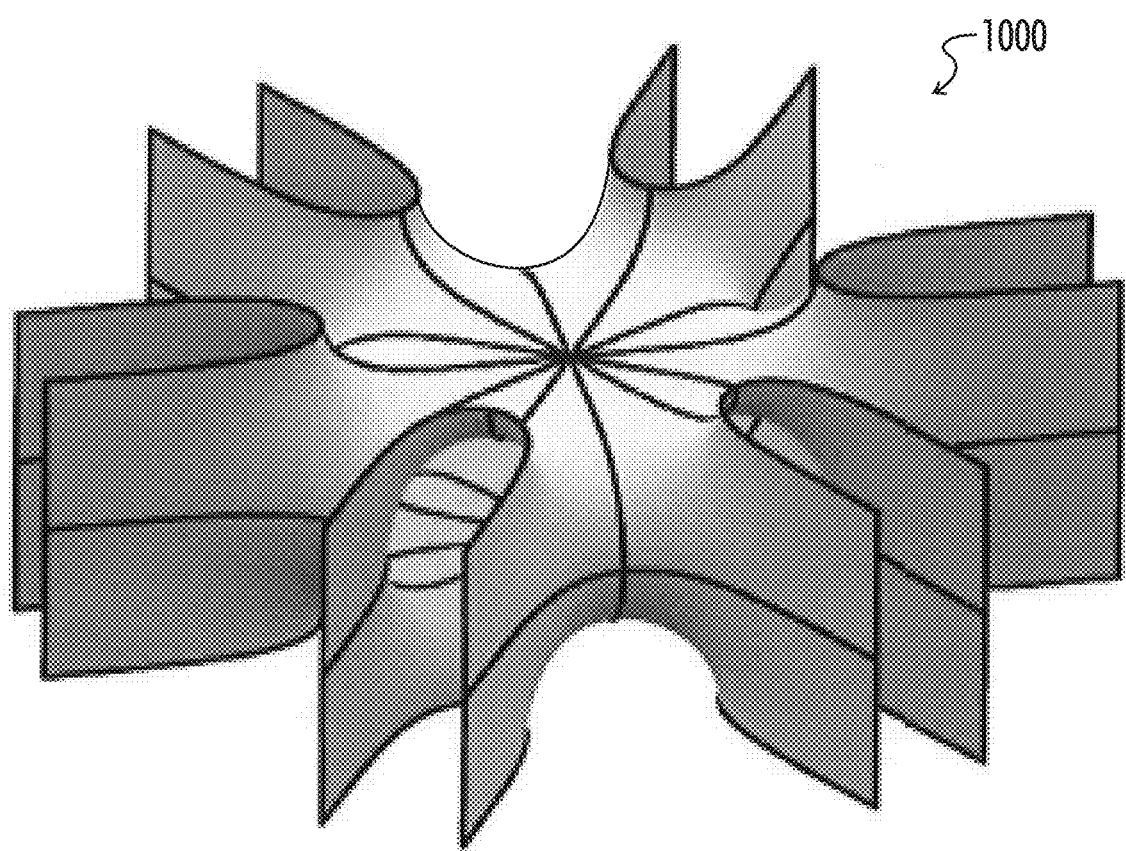
FIG. 10 depicts the hydrophobic volume of the hydrophilic/hydrophobic contact surface of FIG. 9.

Hydrophilic/hydrophobic contact surfaces are minimal surfaces with the hierarchical structures acting as boundary surfaces. FIG. 10 illustrates the water contact surface 1000 immersed in the lipid phase.

Figure 11:
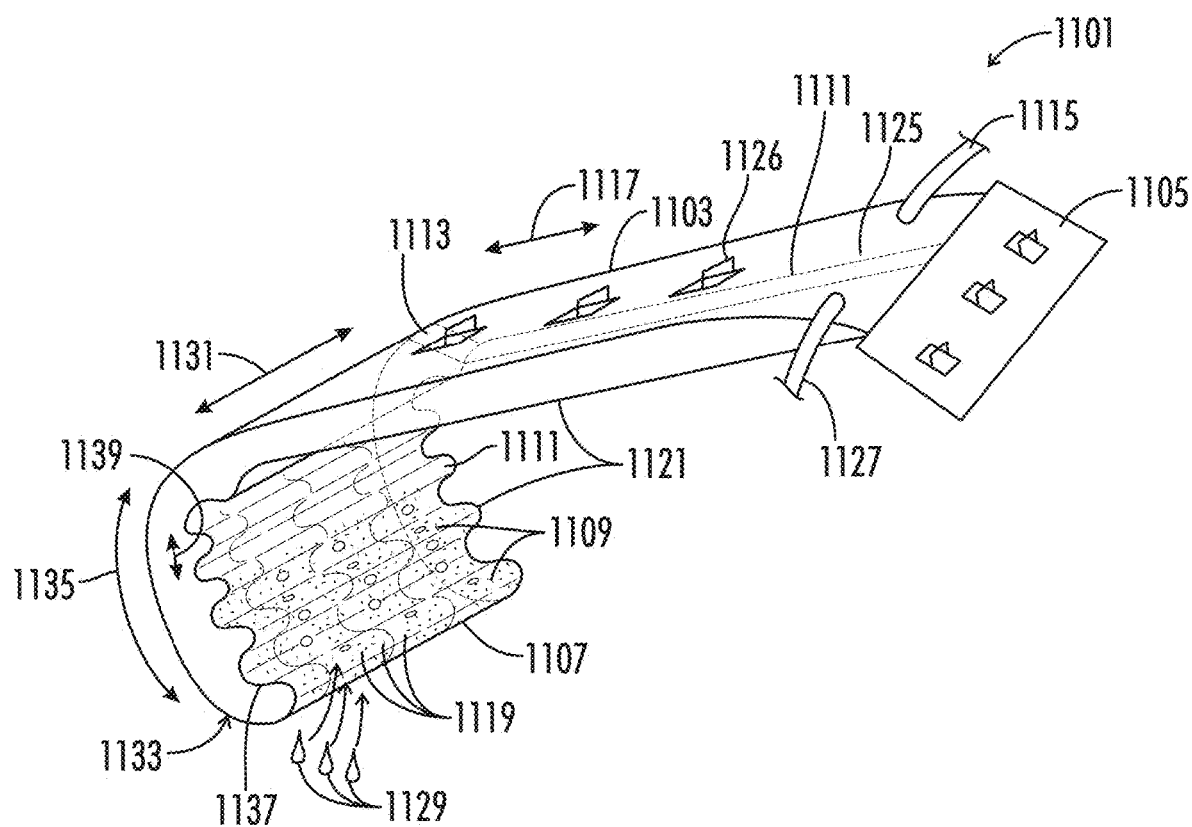
FIG. 11 depicts an example of a retractor device comprising a microstructured surface of the present disclosure.

In some embodiments, the surface is disposed on a portion of a medical device. An implantable medical device may advantageously resist translations in situ due to the surface disclosed herein. In some embodiments, the device is a surgical retractor. FIG. 11 depicts a retractor 1101 comprising arm 1103 and surgical anchor 1105. The surgical anchor 1105 enables the surgeon to anchor the retractor 1101 to perioperative surgical dressing. The proximal end 1107 of the retractor 1101 possesses superhydrophobic surface 1109. Detailed examples of superhydrophobic surface are depicted and described above. Optionally, the retractor may comprise an inflation element 1111 comprised on a hollow section 1113 that can be pressurized via tube 1115. As depicted, when hollow section 1113 is inflated the retractor becomes rigid and straight along direction 1117. Optionally, the retractor may comprise a suction bladder comprising a series of holes 1119 providing throughput from tissue contacting side 1121 to an internal suction volume. The suction bladder comprises the tissue contacting side 1121 and an external side 1125. External side 1125 may possess tabs 1126 to which a surgeon may suture a stay line or grasp to position retractor 1101 relative to a tissue surface. A suction tube 1127 attached to the suction bladder provides suction and draws tissue fluid 1129 into the suction bladder. Optionally retractor 1101 may possess a preformed shape such that the width 1131 is straight and the length 1133 is curved with radius of curvature 1135. Optionally, the retractor 1101 possesses a tissue contacting surface 1121 which is corrugated 1137. The corrugation frequency 1139 can be adjusted through inflation element 1111, such that increased inflation decreases frequency 1139 and increases length 1133.

Figure 12:
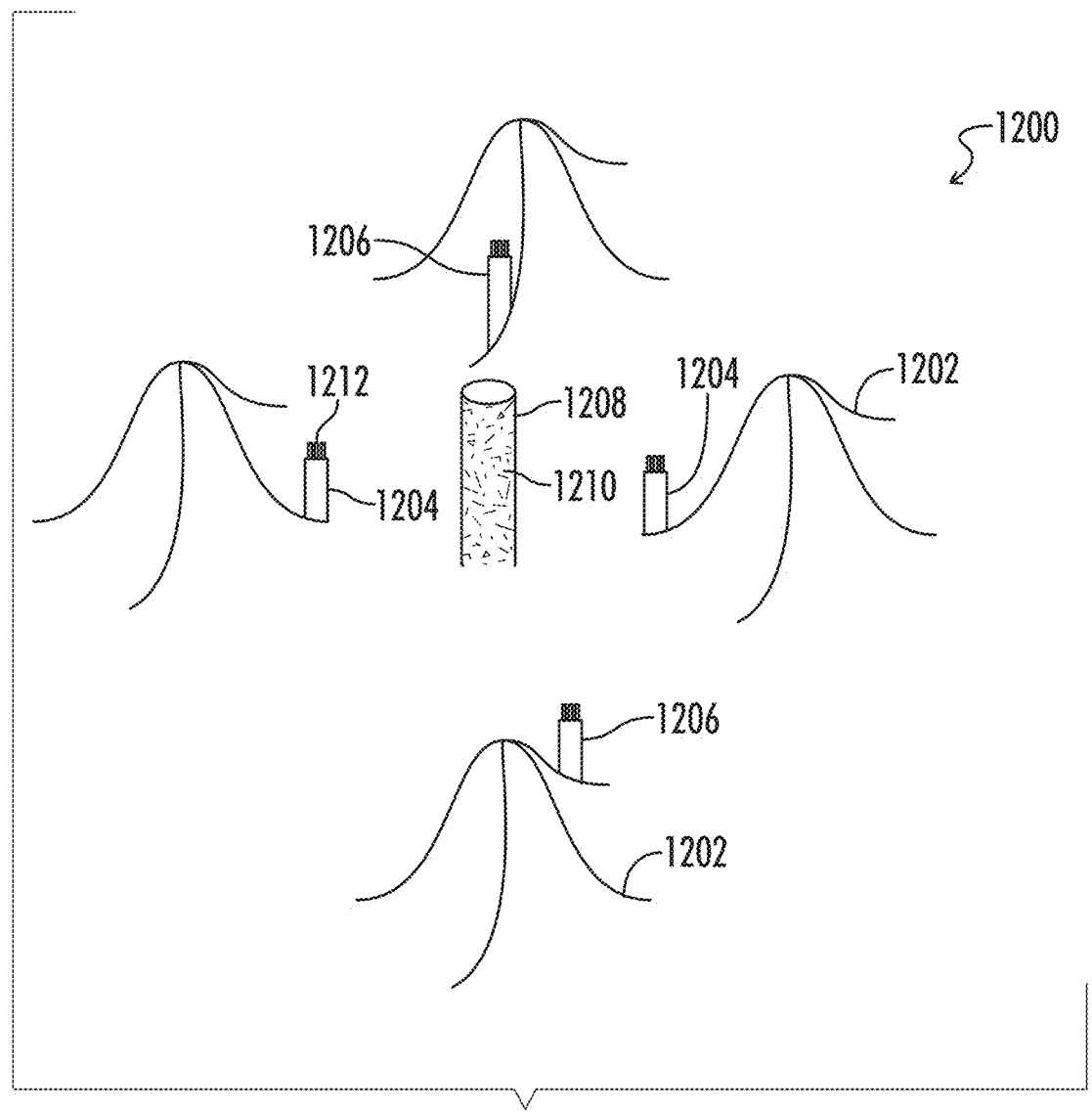
FIG. 12 depicts a particular embodiment of a hierarchical microstructure surface comprising a sinusoid L1 level, on which are L2 level smooth pillars at a lower height and smooth pillars at a higher height, and valley-located L2 level pillars with nanostructure on the wall of the pillar.
Figure 13:
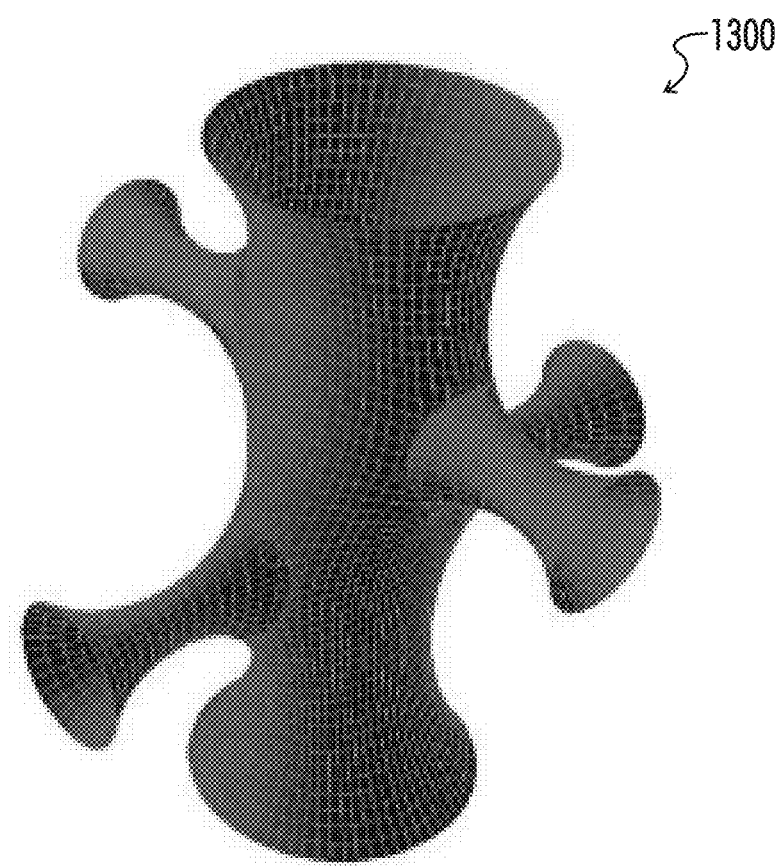
FIG. 13 depicts the hydrophobic volume of the hydrophilic/hydrophobic contact surface of FIG. 12.

In a three level embodiment, FIG. 12 illustrates a hierarchical microstructure surface 1200 comprising a sinusoid L1 level 1202, on which are L2 level smooth pillars 1204 at a lower height and smooth pillars 1206 at a higher height, and valley-located L2 level pillars 1208 with nanostructure 1210 on the wall of the pillar 1208. The tops of pillars 1204 and 1206 are populated with L3 level smaller pillars 1212. The features 1210 and 1212 are hydrophobic. The hydrophobic volume 1300 of the hydrophilic/hydrophobic contact surface is illustrated in FIG. 13.

Figure 14:
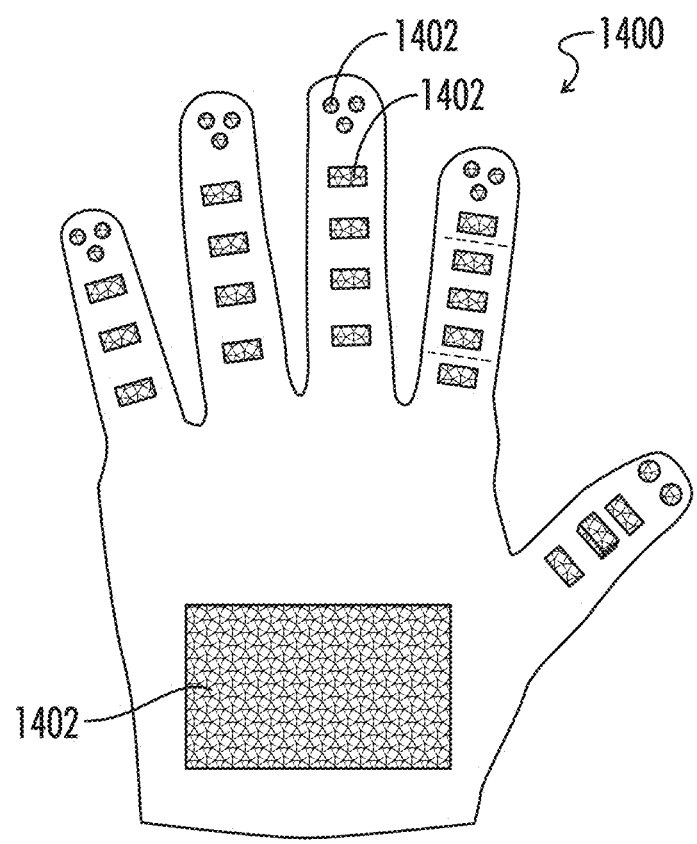
FIG. 14 depicts a glove comprising a microstructured surface of the present disclosure.

FIG. 14 depicts a glove 1400 comprising a microstructured surface 1402 of the present disclosure disposed in different areas of the glove.

Figure 15:
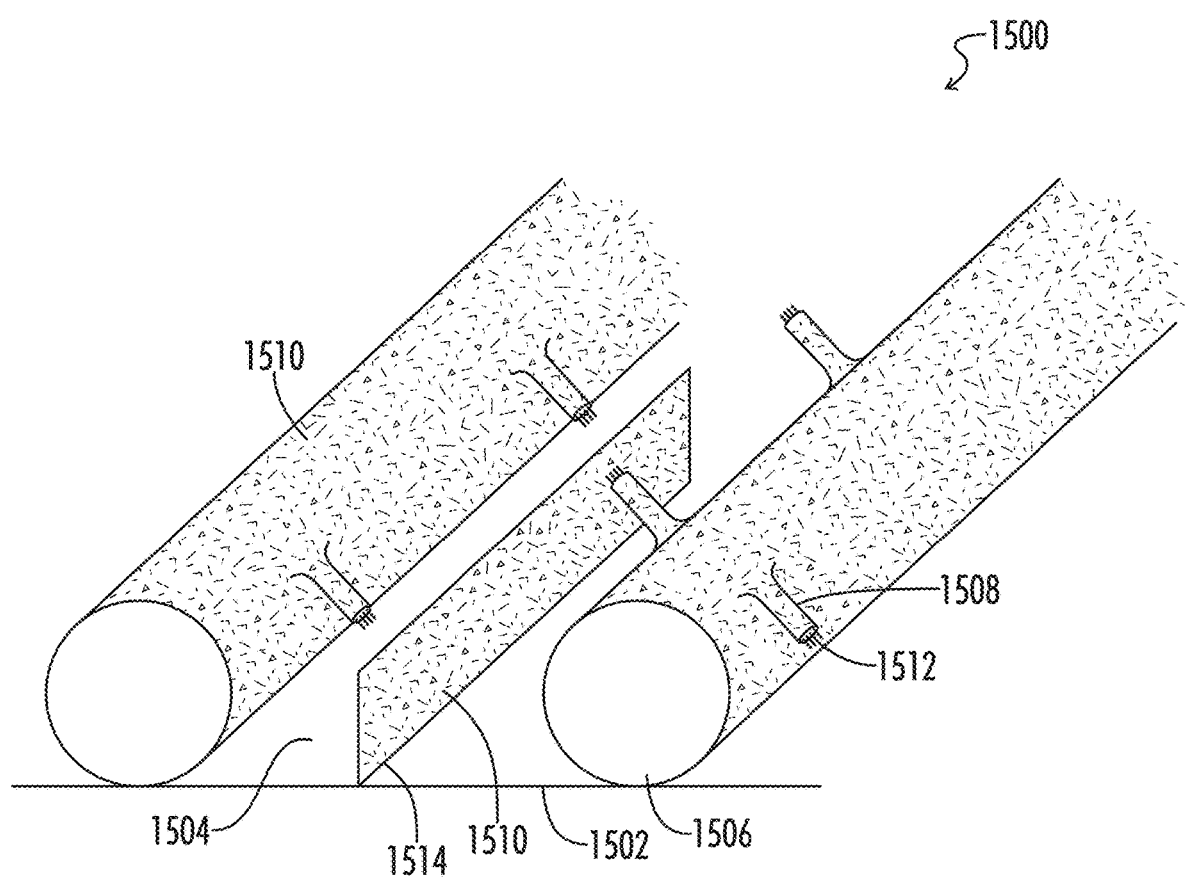
FIG. 15 depicts a particular embodiment of a hierarchical microstructure comprising L1 level cylinders, channels and ridges, L2 level cylinders, and L3 level nanostructure and micro pillars.
Figure 16:
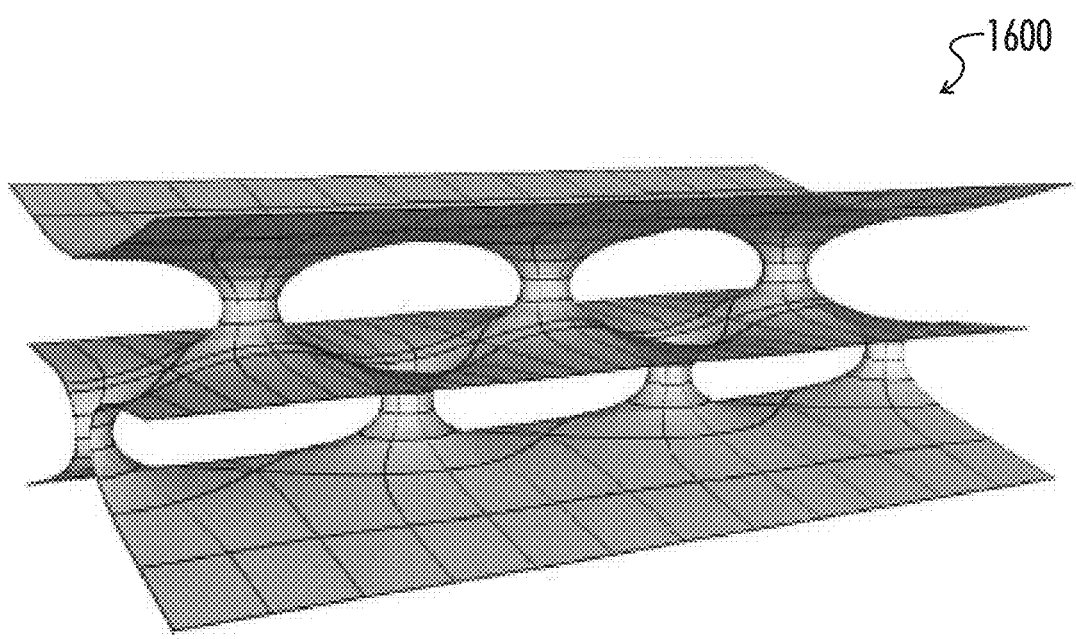
FIG. 16 depicts the hydrophobic volume of the hydrophilic/hydrophobic contact surface of FIG. 15.

FIG. 15 depicts an embodiment of a hierarchical microstructure 1500 comprising a substrate 1502 on which are disposed L1 level cylinders 1506, channels 1504 and ridges 1514, L2 level cylinders 1508, and L3 level nanostructure 1510 and micro pillars 1512. The hydrophobic volume 1600 of the hydrophilic/hydrophobic contact surface is illustrated in FIG. 16.

Figure 17:
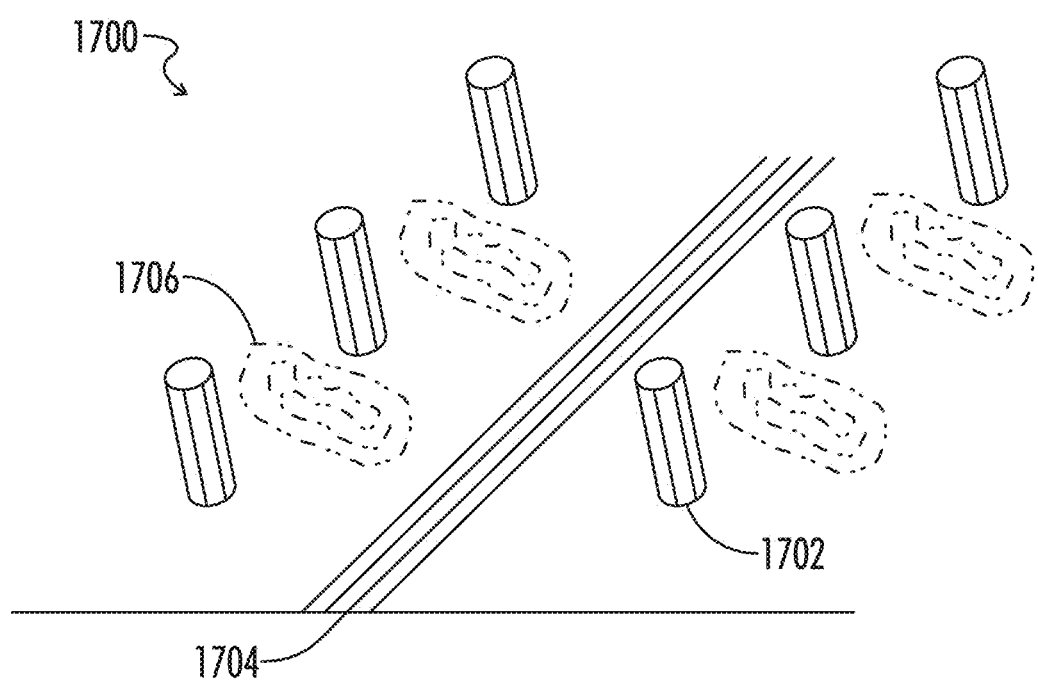
FIG. 17 depicts a particular embodiment of a hierarchical microstructured pattern comprises L1 level fluted pillars and channels and L2 level nanostructure.
Figure 18:
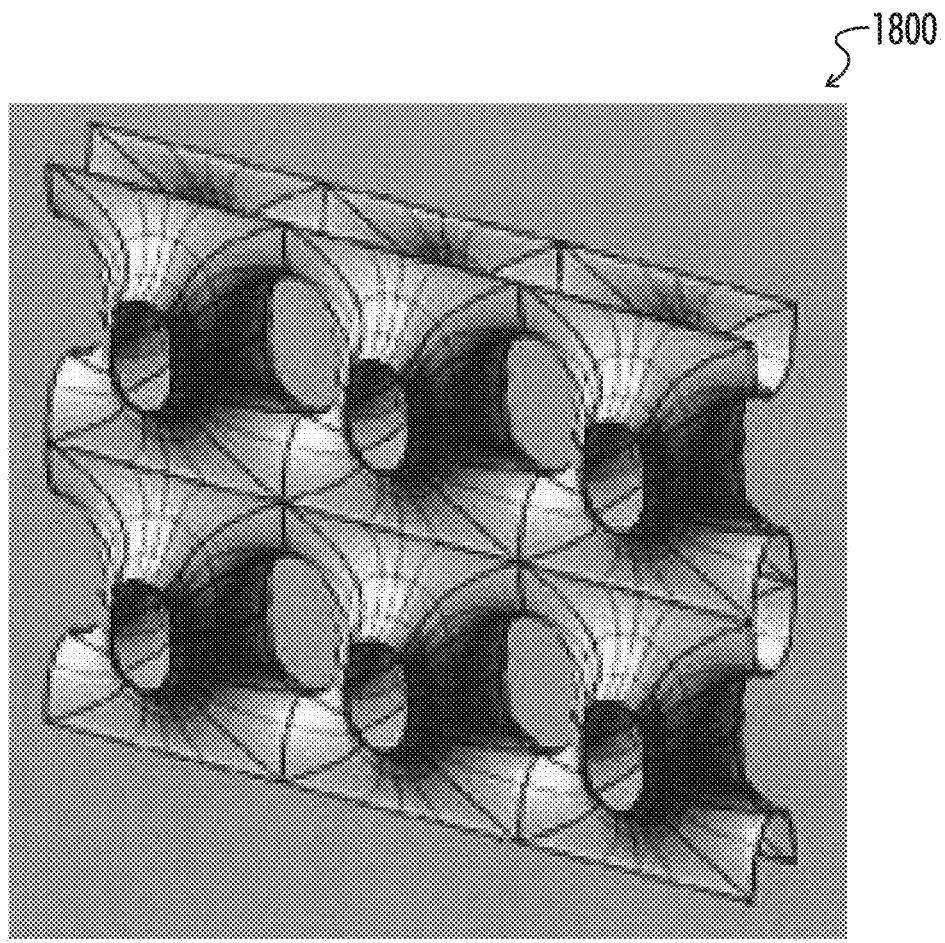
FIG. 18 depicts the hydrophobic volume of the hydrophilic/hydrophobic contact surface of FIG. 17.

The difference between triangle centered arrays (FIG. 10) and square centered arrays (FIG. 18) can be enhanced by appreciating the minimal contact surfaces. In an embodiment, FIG. 17 is a hierarchical microstructured pattern 1700 comprising L1 level fluted pillars 1702 and channels 1704, and L2 level nanostructure 1706. The hydrophilic volume 1800 of the hydrophilic/hydrophobic contact surface is illustrated in FIG. 18.

Figure 19:
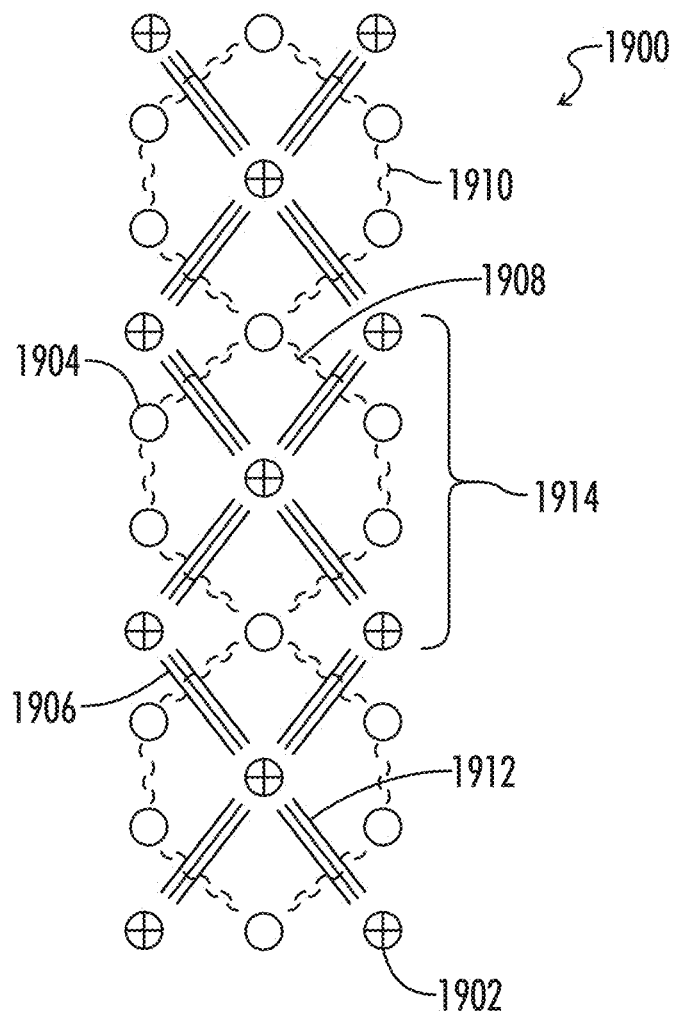
FIG. 19 depicts a particular embodiment of a contact surface frustrated hierarchical microstructured pattern. The frustrated hierarchical pattern comprises a triangular array of L1 pillars, a portion of which have L2 fluted surface and another portion of have L2 nanostructure. The hydrophilic pillars are connected by hydrophilic channels.

Appreciation of the minimal surface structure of the hydrophilic/hydrophobic contact surface enables design of hierarchical microstructured patterns that are contact surface frustrated. FIG. 19 is an embodiment of a contact surface frustrated hierarchical microstructured pattern 1900. The frustrated hierarchical pattern comprises a triangular array of L1 pillars, a portion of which are hydrophilic and have L2 fluted surface 1902 and another portion of which are hydrophobic and have L2 nanostructure 1904. The hydrophilic pillars 1902 are connected by hydrophilic channels 1906. The hydrophobic pillars 1904 are connected by hydrophobic nanostructure 1908. As described above, a connected hydrophobic volume in the shape of a hexagon 1910 is expected to organize on the pillars of 1904. Similarly, a contact hydrophilic volume in the shape of a rhombus 1912 is expected to organize on the pillars of 1902. However, in the region 1914, part of the region will organize hydrophobically, having been initiated by the hydrophobic structure 1910; and another part of region 1914 will organize hydrophilically, having been initiated by the hydrophilic structure 1912. The region 1914 is frustrated, under certain conditions the hydrophobic structure will complete, and under slight perturbation the hydrophilic structure will complete. Contact frustrated hierarchical microstructure patterns are particularly useful in patterned devices intended to be localized on a wet oily surface.

Figure 20:
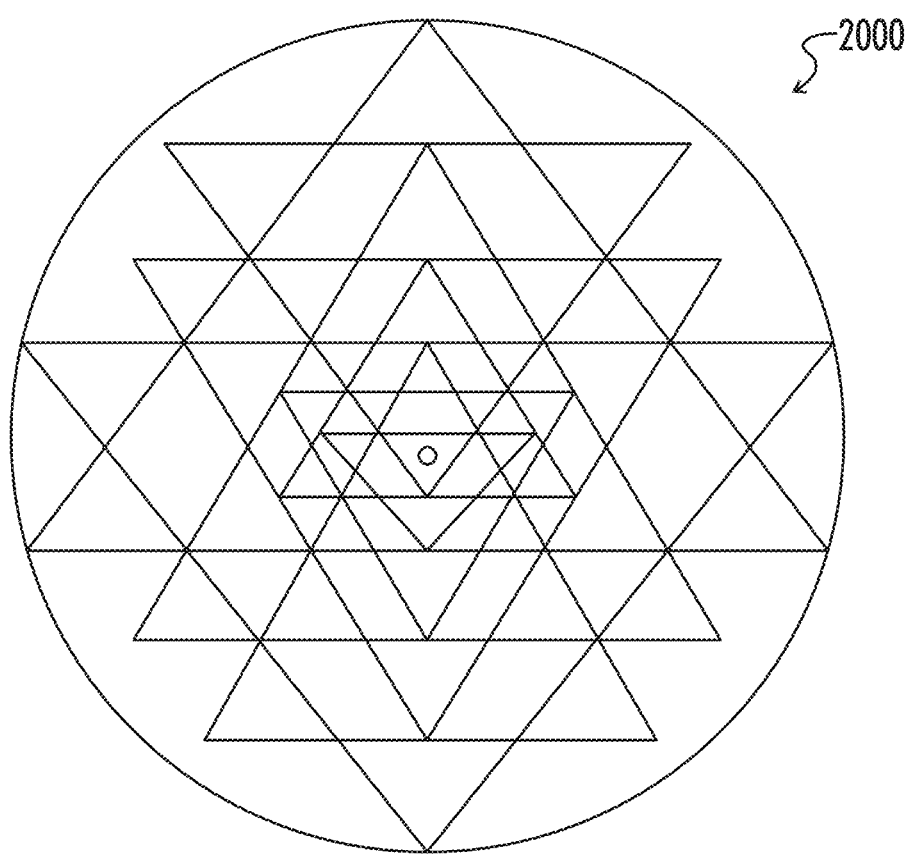
FIG. 20 depicts a particular embodiment of a two-dimensional contact surface frustrated hierarchical microstructure pattern.

The aforementioned embodiment of FIG. 19, in which one fundamental line is illustrated, is a one-dimensional contact surface frustrated hierarchical microstructure pattern because adjacent lines are not frustrated. An embodiment of a two-dimensional contact surface frustrated hierarchical microstructure pattern is illustrated in FIG. 20. FIG. 20 illustrates a unit cell 2000 of the embodiment. The unit cell may be tiled in a triangular array or in a square array. The circular perimeter of the unit cell in a tiling is alternatingly hydrophobic and hydrophilic, for example, lines of nanostructures and lines of channels, respectively. The triangle in FIG. 20 has two orientations, upward pointing and downward pointing. There are four upward pointing triangles and 5 downward pointing triangles. If the circular perimeter is hydrophobic, then the 5 downward pointing triangles are comprising hydrophilic channels. If the circular perimeter is hydrophilic, then the 5 downward pointing triangles are comprising lines of hydrophobic nanostructures. The vertices of the triangles are hydrophilic fluted columns if the lines are hydrophilic, or hydrophobic nanostructure columns if the lines are hydrophobic. The center point is a column of the same hydrophilicity as the perimeter.

Methods of Fabrication

Various methods of fabricating hierarchical structures are contemplated herein. One such method is the production of microstructures using surface structure replication and the subsequent production of nano asperities via the self-assembly of hydrophobic alkanes.

Additionally, a number of superhydrophobic surfaces have been fabricated with hierarchical structures using molding, electrodeposition, nanolithography, colloidal systems and photolithography. Molding is a low cost and reliable way of surface structure replication and can provide a precision on the order of 10 nm. Self-assembly of the nanostructures may be achieved via various methods familiar to one of ordinary skill in the art, for example, thermal deposition and/or evaporation processes.

In the following examples, the levels of the hierarchies will be labeled by levels, designated L#, where # indicates the level. Higher levels correspond to finer microstructure. In all examples, silicon master molds were made from which we obtained silicone negatives. The negatives were used to create positive test articles, either through solution casting or melt pressure casting. These methods are familiar to one of ordinary skill in the art.

EXAMPLES

Experimental Example 1

In an embodiment, a polypropylene hierarchical microstructure device was fabricated with the following dimensions:

| | | | | |
|---|---|---|---|---|
| L3: | 3 μm circle/fins | 6 μm pitch | triangular array | 4 μm height |
| L2: | 35 μm circle | 45 μm pitch | triangular array | 45 μm height |
| L1: | 750 μm sinusoid | 750 μm pitch | triangular array | 220 μm height |

Triangular array refers to offset packing of the indicated feature. Pitch refers to the distance between feature centers along a defined line, and the distance between defined lines. Circle refers to a cylinder with flat top. Fin refers to lateral projections aligned with the axis of the cylinder. FIG. 21 is an image of a representative sample of Example 1.

The solid-oil-liquid interface was mapped by placing the hierarchical microstructure device in a tray containing a mixture of vegetable oil and aqueous green food coloring. The patterned side was place upward in the tray. Upon mixing, a silicone membrane was placed on the microstructure device, completing the device-surface interface. The assembly was frozen. Upon solidification, the silicone layer was removed and the interface configuration photographed. Referring to FIG. 22, water pinning (dark gray) 2202 is depicted on L2 and L1 microstructures 2200.

Experimental Example 2

In an embodiment, a polypropylene hierarchical microstructure device was fabricated with the following dimensions:

| | | | | |
|---|---|---|---|---|
| L3: | 10 μm square | 20 μm pitch | rectangular array | 25 μm height |
| L2: | 100 μm square | 200 μm pitch | rectangular array | 70 μm height |
| L1: | 100 μm channels | 200 μm pitch | parallel channels | 100 μm height |

A representative sample is depicted in FIG. 23.

Experimental Example 3

The terminal hierarchical level of a hierarchical microstructured device, Pattern 68, was replaced with smooth hydrophobic and smooth hydrophilic coating. Pattern 68 comprising pillars on top of pillars was constructed and tested in shear when placed against beef steak. The test articles were Pattern 68 alone and Pattern 68 with the terminal level replaced. Polyurethane (AP1780), polylactic acid (PLA) and Silicone were the test materials. All results are given in lbs/cm2 units. Five samples were tested in each study arm.

In Order of Increasing Hydrophobicity

| AP1780  PLA  Silicone Test Article HMSS alone | shear force (lbs/cm2) |
|---|---|
| AP1780 | 0.046+/−0.007 |
| PLA | 0.059+/−0.005 |
| Functionalized HMSS | |
| PLA on AP1780 HMSS | 0.031+/−0.004 |
| Pattern 68-L1, AP1780 on PLan HMSS | 0.068+/−0.006 |
| Pattern 68-L1, Silicone on PLan HMSS | 0.043+/−0.004 |

Experimental Example 4

Measurement of the shear force for fluted large sinusoidal petal design (FIG. 21) cast on silicone with 300, 400, 500 micron sinusoid depth was performed. The results were compared to a non-sinusoidal pattern (Pattern 86). Patterned devices were cast of absorbable polyurethane AP1780, absorbable polyurethane AP1959, and polylactic acid (PLA).

Materials and Methods:

PLA 704 dissolved in acetone was used.

Mechanical localization characteristics were assessed. Cutlets of bovine "steak" were purchased and sliced into 3 cm cubes and affixed to a localized platform. The meat was kept well hydrated with physiologic saline solution at 22° C. Test articles were cut to 1×1 cm squares and mounted on discs to which was attached the filament through which force would be applied to the test article. Shear was measured by placing the test article on the 3 cm cube of meat and pulling horizontally to the surface. Thus these measurements yield a force per unit area (1 cm2).

In all measurements, clear outliers were discarded, and the run was repeated with additional test articles. An Instron Mini 55 was used to record force and the crosshead speed was 0.1 cm/sec. The load cell limit was 200 g with an accuracy of +/−0.1 g.

Patterns:

| | |
|---|---|
| 85A | L3: 3 micron circular pillars, 6 micron pillar pitch, 5 micron pillar depth. L2: 25 micron circular pillars, 35 micron pillar pitch, 30 micron pillar depth, includes flutes 3 micron flute width, 6 micron flute pitch, 5 micron flute depth |
| 087A | L1: 450 micron sinusoids, 450 micron pitch, 300 micron depth |
| 088A | L1: 600 micron sinusoids, 600 micron pitch, 400 micron depth |
| 089A | L1: 750 micron sinusoids, 750 micron pitch, 500 micron depth |

Test Articles:

| | |
|---|---|
| 090A | Combination of pattern 085A and 087A (L1 300 micron sinusoid depth - actual was 90 microns deep); actual means the actual depth of the sinusoid on the mold |
| 091A | Combination of pattern 085A and 088A (L1 400 micron sinusoid depth - actual was 160 microns deep) |
| 092A | Combination of pattern 085A and 089A (L1 500 micron sinusoid depth - actual was 205 microns deep) |

Stacked, Fluted, Sinusoid (093AH):
 Primary: 25 μm circular holes, 35 μm pitch, 45 μm depth
 Includes flutes 3 μm wide, 6 μm pitch, 5 μm deep
 Secondary: 3 μm circular holes, 6 μm pitch, 5 μm depth
 Sinusoid Background: 450 μm sinusoid holes, 450 μm pitch, 300 μm depth Stacked, Fluted, Sinusoid (094AH):
 Primary: 25 μm circular holes, 35 μm pitch, 45 μm depth
 Includes flutes 3 μm wide, 6 μm pitch, 5 μm deep
 Secondary: 3 μm circular holes, 6 μm pitch, 5 μm depth
 Sinusoid Background: 600 μm sinusoid holes, 600 μm pitch, 400 μm depth Stacked, Fluted, Sinusoid (095AH):
 Primary: 25 μm circular holes, 35 μm pitch, 45 μm depth
 Includes flutes 3 μm wide, 6 μm pitch, 5 μm deep
 Secondary: 3 μm circular holes, 6 μm pitch, 5 μm depth
 Sinusoid Background: 750 μm sinusoid holes, 750 μm pitch, 500 μm depth Stacked, Fluted, Sinusoid (086AH):
 Primary: 25 μm circular holes, 35 μm pitch, 45 μm depth
 Includes flutes 3 μm wide, 6 μm pitch, 5 μm deep
 Secondary: 3 μm circular holes, 6 μm pitch, 5 μm depth Results:

Pull Tests:

All measurement rounded to nearest gram. All measurements were done with a 1.0 gram disc.

All measurements were done with fresh casts to avoid texture filling.

Comparison AP1780, AP1959, PLA

| Texture | Moist meat (grams force) |
|---|---|
| 093A, (PLA) N = 10 | 148+/−20 |
| 093A, (AP1780) N = 10 | 84+/−12 |
| 093A, (AP1959) N = 10 | 89+/−19 |
| 094A, (PLA) N = 10 | 169+/−28 |
| 094A, (AP1780) N = 10 | 92+/−7 |
| 094A, (AP1959) N = 10 | 95+/−14 |
| 095A, (PLA) N = 10 | 174+/−22 |
| 095A, (AP1780) N = 10 | 112+/−23 |
| 095A, (AP1959) N = 10 | 117+/−12 |

The above non-limiting exemplary applications make apparent to one of ordinary skill in the art numerous other applications that can be envisioned with the hierarchical microstructured surfaces of the present invention.

What is claimed is:

1. A device comprising a microstructured surface having at least two hierarchical levels that are self-similar, including a first level and a second level, each of the first and second levels include microfeatures wherein the first level microfeatures have a width of 1 to 20 microns, a height of 1 to 20 microns, and a pitch between adjacent microfeatures of 1 to 20 microns, the second level microfeatures have a width of 10 to 500 microns, a height of 50 to 200 microns, and a pitch between adjacent microfeatures greater than 50 microns up to 200 microns, the first level being disposed about the second level, the height and the width of the first and second microfeatures being scaled by a constant factor, the at least two hierarchical levels produce Wenzel-Cassie fluid pinning states when placed in contact with a wet surface,
wherein the microstructured surface comprises a first plurality of the at least two hierarchical levels and a second plurality of the at least two hierarchical levels, wherein the first plurality is positioned at a first height about the microstructured surface, and the second plurality is positioned at a second height about the microstructured surface, wherein the first height and second height are different and create split contact levels capable of generating split contact Wenzel-Cassie wetting states.

2. The device of claim 1, wherein the at least two hierarchical levels produce frustrated wetting states.

3. The device of claim 2, wherein the at least two hierarchical levels produce frustrated contact surfaces.

4. The device of claim 1, wherein the at least two hierarchical levels produce metastable wetting states on at least one hierarchical level.

5. The device of claim 1, wherein the at least two hierarchical levels possess a periodicity capable of accommodating a wrinkle eigenmode of a target deformable surface.

6. The device of claim 2, wherein the at least two hierarchical levels inhibit the evolution of a buckled state in a target deformable surface when a shear force is applied to said device.

7. The device of claim 3, wherein the at least two hierarchical levels inhibit translation of the device when in contact with a deformable surface when a shear force is applied to said device.

8. The device of claim 1, wherein the microstructured surface further comprises a smooth chemical surface with the same hydrophilicity, hydrophobicity, oleophobicity or oleophilicity of at least one of the at least two hierarchical levels.

9. The device of claim 1, wherein the microstructured surface further comprises a third level disposed hierarchically about the first level of the first plurality, or the second plurality, or both.

10. The device of claim 9, wherein the third level is 100-10,000 microns in width.

11. The device of claim 9, wherein the third level is 100-10,000 microns in height.

12. The device of claim 9, wherein the third level includes a pitch of 100-10,000 microns.

13. The device of claim 1, wherein the microstructured surface, when in contact with a wet contact surface, forms an interface, the interface comprising a solid contact surface, a hydrophobic liquid contact surface, and a hydrophilic liquid contact surface.

14. The device of claim 1, wherein the microstructured surface, when in contact with a wet surface forms an interface, the interface comprising a solid contact surface, a gas contact surface, and a hydrophilic liquid contact surface.

15. The device of claim 1, wherein the at least two hierarchical levels are multi-periodic, and wherein at least one period matches one or more wrinkle eigenmodes of a target deformable surface.

16. The device of claim 13, wherein at least two contact surfaces are frustrated.

17. The device of claim 13, wherein Shallamach motion in a target contact surface is inhibited.

18. The device of claim 1, wherein at least one Wenzel-Cassie wetting state transitions to a Wenzel wetting state when at least 1 mN of shear force is applied to said device.

19. The device of claim 1, wherein at least one Wenzel-Cassie wetting state transitions to a Cassie-Baxter wetting state when at least 1 mN of shear force is applied to said device.

20. The device of claim 1, wherein device comprises an implantable mesh that is biocompatible.

* * * * *